United States Patent [19]
Nishimura et al.

[11] Patent Number: 5,933,726
[45] Date of Patent: *Aug. 3, 1999

[54] METHOD OF FORMING A SEMICONDUCTOR DEVICE HAVE A SCREEN STACKED CELL CAPACITOR

[75] Inventors: Michio Nishimura, Tokorozawa; Kazuhiko Saitoh, Ami-machi; Masayuki Yasuda, Kunitachi; Takashi Hayakawa, Fussa; Michio Tanaka, Ohme; Yuji Ezaki, Tsuchiura; Katsuo Yuhara, Ami; Minoru Ohtsuka, Fussa; Toshikazu Kumai, Ohme; Songsu Cho, Fujishiro-machi; Toshiyuki Kaeriyama, Yawara-mura; Keizo Kawakita, Ohme; Toshihiro Sekiguchi, Hidaka; Yoshitaka Tadaki, Hannoh; Jun Murata, Kunitachi; Hideo Aoki, Hamura; Akihiko Konno, Ohme; Kiyomi Katsuyama, Hamura; Takafumi Tokunaga, Iruma, all of Japan; Yoshimi Torii, Irving, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/709,203

[22] Filed: Aug. 27, 1996

[30] Foreign Application Priority Data

Sep. 1, 1995 [JP] Japan .................................. 7-248499

[51] Int. Cl.$^6$ ............................................. H01L 21/8242
[52] U.S. Cl. ............................................. 438/254; 438/254
[58] Field of Search ........................... 365/149; 257/300, 257/306, 309, 307, 308, 534; 438/253–256, 393–399

[56] References Cited

U.S. PATENT DOCUMENTS

| | | | |
|---|---|---|---|
| 5,381,365 | 1/1995 | Ajika et al. | 365/149 |
| 5,434,439 | 7/1995 | Ajika et al. | 257/309 |
| 5,471,418 | 11/1995 | Tanigawa | 365/149 |
| 5,621,606 | 4/1997 | Hwang . | |
| 5,712,182 | 1/1998 | Madan . | |

*Primary Examiner*—Jey Tsai
*Attorney, Agent, or Firm*—Bret J. Petersen; William B. Kempler; Richard L. Donaldson

[57] ABSTRACT

A semiconductor device, such as a dynamic RAM, and method of making it. A number of stacked cell capacitors are placed at a prescribed spacing in an alignment direction on top of a p$^-$-type silicon substrate (1). Each capacitor has a nearly perpendicular cylindrical lower electrode (cylindrical polysilicon layer (96)), a dielectric film (silicon nitride film (77)), and upper electrode (plate electrode (78) made of polysilicon). The spacing in the alignment direction is smaller than the inner diameter of the lower electrode.

4 Claims, 19 Drawing Sheets

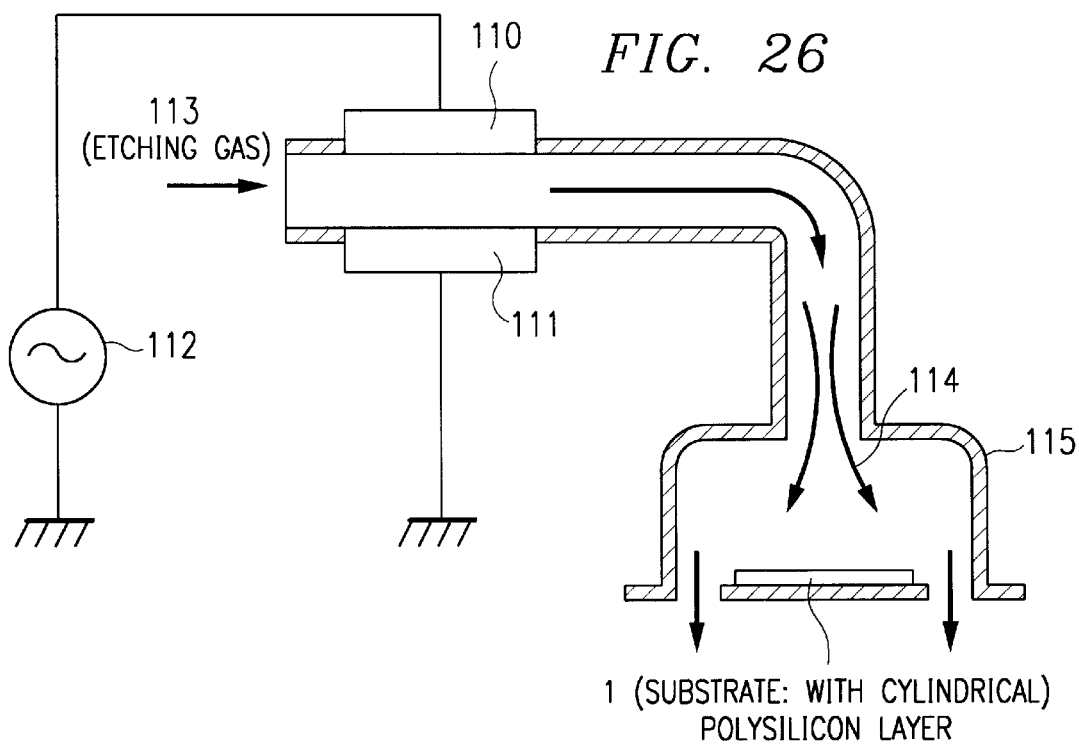

METHOD OF FORMING A SEMICONDUCTOR DEVICE HAVE A SCREEN STACKED CELL CAPACITOR

FIELD OF THE INVENTION

Our invention relates to a semiconductor device, and more particularly to a dynamic random-access memory (DRAM) having screen (for example cylindrical) stacked cell capacitors, and a method of manufacturing it.

BACKGROUND OF THE INVENTION

Semiconductor integrated circuit devices, such as dynamic RAMs, with screen partitioned type structural elements in the memory cell section, for example, stacked cell capacitors formed with a cylindrical shape for increasing the capacity, can be manufactured by conventional processes such as those shown in FIGS. 28–33.

In this memory cell section, as shown in FIG. 28, the element region is provided by a field $SiO_2$ film 2 that is formed on top of the $p^-$-type silicon substrate 1 by the LOCOS (local oxidation of silicon) method, a gate oxide film 5 is formed in this element region, and on top of this, a polysilicon word line WL and an $SiO_2$ insulating layer 6, which are provided on the side wall 60 of the silicon nitride, are formed by CVD (chemical vapor deposition), and the $n^+$-type semiconductor regions 3 (source region) and 4 (drain region) are formed using a self-aligning system using this word line WL as the mask.

A contact hole 49 that reaches the $n^+$-type drain region 4 is provided in this insulating layer 6, and bit line BL is adhered and formed. The upper surface of the bit line BL is protected by insulating layer 61, and side wall 62 is provided on its side surface. Contact hole 10 is formed in a portion of the insulating layers 6 and 70 on top of source region 3, and the polysilicon layer 11, which forms a portion of the lower electrode (storage node) of the capacitor, is deposited by CVD so as to include this contact hole 10 and connect to source region 3.

An oxide insulating film 71 made of a phosphosilicate glass that acts as a support pillar (or is used as a spacer that regulates the shape of the polysilicon lower electrode) when forming the cylindrical (crown-shaped) polysilicon lower electrode for the cylindrical stacked cell capacitor, which will be presented below, is formed by CVD on top of this polysilicon layer 11, and a photoresist mask 72 is then formed in the prescribed pattern for etching this insulating layer 71 to the shape of the spacer.

Then, as shown in FIG. 29, insulating layer 71 is dry etched using the mask 72, and the silicate glass layer 71 directly beneath the unmasked region 73 is selectively removed. As an etching gas for this dry etching, a mixed gas of $CF_4$, $CHF_3$, and Ar ($CF_4/CHF_3/Ar$) is used, but as is illustrated, etching perpendicularly is very difficult, and it can be etched in the shape of an inverted frustum with a slanted surface 74.

When the insulating layer surface region beneath the unmasked region 73 in FIG. 29 is etched, the accumulated substances 75 from the etching gas (particularly that generated from $CHF_3$) adheres on the top of the slanted surface, so the slanted surface is completely covered before the etching is done in the perpendicular direction. This type of condition successively creates a virtual line in the thickness direction of insulating layer 71 and is thought to occur because of the mask operation in relation to the dry etching. The accumulated substance 75 is generated on the side surfaces of the insulating layer 71 that remain in the shape of a spacer with the dry etching, but in the following figures, the illustrations are omitted for the purpose of simplification.

Next, as shown in FIG. 30, after forming the polysilicon layer 76, which becomes the lower electrode of the capacitor, over the entire surface by CVD, as shown in FIG. 31, the polysilicon layer 76 is uniformly etched from the position of the broken line, the polysilicon layer 11 of the foundation is also further etched, and the polysilicon layer 76 is left on the side surface of spacer material 71. In this etching, a mixed gas of $Cl_2$ and $O_2$ ($Cl_2/O_2$), which has superior isotropic properties, is used, but as mentioned above, because the side surface of spacer 71 has a slanted surface, at the same time as etching gas is operating (this is, perpendicular to substrate 1) in a direction perpendicular to the substrate in the polysilicon layer 76 on top of the slanted surface, etching is also done in the thickness direction of the polysilicon layer 76.

As a result, as shown in FIG. 31, on the side surface of spacer material 71, the thickness of the polysilicon layer 76, which should be left in the thickness of the shaded area, becomes thin. Since, in this way, the electrical resistance of the lower electrode of the capacitor increases, it is undesirable.

The spacer material 71 supported by the side surface of polysilicon layer 76, as shown in FIG. 32, is removed by dry etching, which uses $CF_4/CHF_3/Ar$ as an etching gas, or by wet etching, and forms the cylindrical polysilicon lower electrode 76, with a cross section in the shape of a frustum that is connected to the $n^+$-type region 3 of substrate 1.

Following that, as shown in FIG. 33, high dielectric film 77 made of polysilicon nitride and capacitor upper electrode (plate electrode) 78 made of polysilicon are deposited over the entire surface by CVD, and memory cell MC' is made with a COB (cell over bit line) construction having a number of stacked cell capacitors CAP' that are separated from each other.

In this type of conventional manufacturing process, as presented above, because the same side surfaces of the spacer material 71 become slanted surfaces due to the patterning of the spacer material 71, particularly as shown in FIG. 29, after the etching of the polysilicon layer 76 shown in FIG. 31, its thickness is easily reduced, causing deterioration in the performance of the electrode.

Thus, to circumvent this problem, as shown in FIG. 34, making the thickness of the polysilicon layer 76 large has been considered, and the side surfaces of the spacer material 71 remain sufficiently thick even by the etching shown in FIG. 35.

However, with this, since the thickness of the polysilicon layer 76 adhered between adjacent spacer material 71-71 also becomes large, there are cases when a polysilicon layer 76 remains between spacer material 71-71 after etching, as well as instances when the polysilicon layer 11 of the foundation is not etched at all. As a result, even when the capacitor is formed using the processes shown in FIGS. 32 and 33, there are cases when current flows between the lower electrodes 76 and 11 of adjacent capacitors, and they do not function.

Therefore, in this case, it is necessary to make the distance between spacer material 71-71 sufficiently large and make sure that the adhered thickness of the polysilicon layer 76 between spacer material does not become large, causing the space between adjacent capacitors to become large, meaning that the demands for high densification and high integration of the memory cell cannot be satisfied.

Also, it can be seen that, during the etching of the polysilicon layer 76, burrs are readily generated on the remaining polysilicon layer 76.

In other words, when the polysilicon layer 76 is etched from the enlarged configuration shown in FIG. 36(A), as shown in FIG. 36(B), the polymer-like accumulated substance 79 generated by the reaction between the etching gas and the polysilicon is created on the inside edge (connecting sections between spacer material 71) of the top of polysilicon layer 76. Also, natural oxide film 80 has already been formed on the top edge of the outer surface of polysilicon 76, and this accumulated substance 79 and natural oxide film 80 are left as is, as burrs, without being etched.

If dielectric film 77 and polysilicon upper electrode 78 are formed with these kinds of burrs remaining, as shown in FIG. 36(C), stress is applied by the burr section, particularly to dielectric film 77, and pinholes are created in that film or localized film thinning (the portion shown by 81 in the figure) occurs. If these types of defects are present, insulation faults and a reduction of voltage resistance of the dielectric film occur, the charge cannot be normally accumulated as a capacitor for the memory cell, and there are instances when the memory cell does not function.

The purpose of our invention is to offer a semiconductor device and its manufacturing method that, along with making the film thickness of the electrode in the screen capacitor sufficiently uniform and fulfilling performance demands, increases the degree of integration, and has excellent reliability in conducting normal operations.

SUMMARY OF INVENTION

Our invention relates to a semiconductor device wherein, along with forming a number of screen capacitors (for example, stacked cell capacitors CAP) are placed at prescribed intervals on a semiconductor substrate (for example, a p⁻-type silicon substrate 1). Each screen capacitor has a nearly vertical, cylindrical lower electrode (for example, a cylindrical polysilicon layer 96), a dielectric film (for example, a polysilicon nitride layer 77), and an upper electrode (for example, a polysilicon plate electrode 78). The spacing in the alignment direction is smaller than the inner diameter of the lower electrode. We call this version 1 of our invention.

According our version 1, since the spacing between the screen capacitors is smaller than the inner diameter of the lower electrode, the degree of integration of the spacers between the adjacent capacitors can be greatly increased. Also, because etching is conducted with excellent anisotropic properties in the perpendicular direction, the penetration of etchant into the spacing equivalent to the unmasked region of the mask used in the patterning of the spacer material that regulates the shape of the lower electrode during manufacture, which causes the accumulation deposits does not readily occur, and the thickness of the capacitor lower electrode can be kept sufficiently large after etching, and the perpendicular shape can be realized.

In version 1, it is desirable that a manufacturing method be used that forms spacer material (for example, silicate glass layer 91) for regulating the shape of the screen capacitors on the semiconductor substrate, forms a number of mask materials (for example, photoresist mask 92) by positioning them at prescribed spaces, and aligns them on the spacer material. At this time, the spacing in the alignment direction is less than the diameter and thickness of the mask materials. Then the spacer material is etched using the mask materials, the spacer material directly beneath the region of the spacing is selectively removed and divided into multiple units, and the inner diameter of the lower electrode is regulated by each spacer material. A structural material layer of the lower electrode is adhered to a surface of the spacer material. The structural material layer is etched, and the structural material layer remains on the side surface of the spacer material. The spacer material is removed and the lower electrode is formed. The dielectric film is formed on a surface of the lower electrode, and the upper electrode is formed on a surface of the dielectric film. This is version 2 of our invention.

In version 2, since the spacing of the etching mask for the spacer material is smaller than its diameter or thickness, the penetration of etchant into the spacing during etching (patterning) of the spacer material does not readily occur, and perpendicular anisotropic etching can be sufficiently performed. In this way, the perpendicular properties of the side surface of the spacer material become excellent, etching in the horizontal direction is prevented when etching the structural material layer of the capacitor lower electrode, and its thickness can be maintained.

As a result, since there is no need to initially make the thickness of the structural material layer for the lower electrode large to prevent the previously mentioned film thinning and the spacing between the capacitors can be made as small as possible, a high density device can be designed and its degree of integration can be increased.

Also, our invention offers a semiconductor device wherein a screen capacitor is provided on top of the semiconductor substrate, and these screen capacitors are formed by a cylindrical lower electrode, dielectric film, and upper electrode with a cross section in the shape of an inverted frustum. Hereinafter, this will be referred to as version 3 of our invention.

In version 3, the lower electrode of the screen capacitor is made with a cross section in the shape of an inverted frustum, but utilizing the previously mentioned fact that an inverted frustum shape is generated in the slanted surface during the etching of the spacer material, by doing this while using a spacer material corresponding to the spacing between the adjacent lower electrodes, the lower electrode is provided in the unmasked region in which the spacer material is removed, and a lower electrode with a cross section in the shape of an inverted frustum can be obtained.

In version 3, it is desirable that a manufacturing method be a process wherein spacer material for regulating the shape of the screen capacitors is formed on the semiconductor substrate; a process for forming a first mask material (for example, photoresist mask 102) on the spacer material; a process for etching the spacer material using the first mask material, selectively removing the spacer material directly beneath the unmasked region, and regulating the outer diameter of the lower electrode; a process for adhering a structural material layer for the lower electrode to a surface of the spacer material; a process for filing a second mask material (for example, photoresist mask 101) in the removing regions of the spacer material from which material has been removed to a height less than the upper surface position of this spacer material; a process for etching the structural material layer that is exposed on the upper surface and the vicinity of the spacer material; a process for removing the second mask material and leaving the structural material layer on the side surface of the spacer material; a process for forming the lower electrode by removing the spacer material; a process for forming the dielectric film on a surface of the lower electrode, and a process for forming the upper electrode on a surface of the dielectric film. Hereinafter, this will be referred to as version 4 of our invention.

In version 4, when forming the lower electrode with the inverted frustum shape of version 3, the side surfaces of the spacer material after etching the spacer material through the unmasked region of the first mask material took on a slanted shape due to the adhesion of accumulated substances, but here, since the structural material layer of the lower electrode that was adhered is protected to the position of the upper surface of the spacer material by the second mask material and is not etched, the remaining lower electrode has a sufficient thickness and the inverted frustum shape, which corresponds to the slanted surface of the spacer material, is exhibited. As a result, in the lower electrode (in other words, the etching section of the spacer material), the spacing between adjacent lower electrodes is made small, and high densification and high integration as a capacitor becomes possible.

Also, our invention offers a method for manufacturing a semiconductor device in which screen capacitors are provided on a semiconductor substrate, and these screen capacitors are formed by a cylindrical lower electrode, dielectric film, and upper electrode, consisting of a process wherein spacer material for regulating the shape of the screen capacitors is formed on the semiconductor substrate; a process for forming a first mask material on the spacer material; a process wherein the spacer material is etched using the mask materials, the spacer material directly beneath the region of the spacing is selectively removed, and the diameter of the lower electrode is regulated; a process wherein a structural material layer of the lower electrode is adhered to a surface of the spacer material; a process wherein etching of the structural material layer of the lower electrode is performed under etching conditions in which the etching selectivity in the oxides is lowered and isotropic etching components are provided, and the structural material layer is left remaining on the side surface of the spacer material in a condition wherein the generation of burrs on the upper edge of the structural material layer as a result of this etching is prevented; a process for removing the spacer material and forming the lower electrode; a process for forming the dielectric film on a surface of the lower electrode; and a process for forming the upper electrode on a surface of the dielectric film. Hereinafter, this will be referred to as version 5 of our invention.

In manufacturing version 5, during the etching of the structural material layer for the lower electrode, since the etching is done under conditions wherein the etching selectivity for the oxides is lowered and isotropic etching components are provided, etching can be done in such a way that the natural oxide film, which has a tendency to be generated on the outer surface and inner surface of the structural material layer for the lower electrode, and the accumulated substances, such as polymers, are not generated, and the generation of burrs can be prevented without increasing the number of processes. Therefore, the dielectric film can be formed with excellent film quality and sufficient thickness on top of the lower electrode, the insulating defects and voltage resistance can be improved, and the reliability heightened.

Also, our invention offers a method for manufacturing a semiconductor device in which screen capacitors are provided on a semiconductor substrate, and these screen capacitors are formed by a cylindrical lower electrode, dielectric film, and upper electrode, consisting of a process wherein spacer material for regulating the shape of the screen capacitors is formed on the semiconductor substrate; a process for forming a first mask material on the spacer material; a process wherein the spacer material is etched using the mask materials, the spacer material directly beneath the region of the spacing is selectively removed, and the diameter of the lower electrode is regulated; a process wherein a structural material layer for the lower electrode is adhered to a surface of the spacer material; a process for etching the structural material layer and leaves the structural material layer on the side walls of the spacer material; a process for performing isotropic etching after the etching, and removing the burrs on the upper edge of the structural material layer that were created due to the etching; a process for forming the spacer material and forms the lower electrode, a process for forming the dielectric film on a surface of the lower electrode; and a process that forms the upper electrode on a surface of the dielectric film. Hereinafter, this will be referred to as version 6 of our invention.

In version 6, compared to version 5, after etching the structural material of the lower electrode, the burrs on the top portion are removed by isotropic etching, but it exhibits the same effects in that the lower electrode can be formed without any burrs, and the film thickness and film quality of the dielectric film can be maintained. Also, even if a process for removing the burrs is added, this can be easily performed by sending it to a separate processing chamber while maintaining the vacuum.

In version 1 the inner side surface of the lower electrodes is almost perpendicular from the bottom edge to the top edge, the outer surface of the lower electrode is almost perpendicular from its bottom edge to a position midway to the top edge, and the film thickness can be made thin from the midway position to the top edge. Also, it is preferable that the lower electrode be connected to the diffusion region of the memory cell section through a contact hole.

In version 2 it is preferable that the spacing of the mask material be made ½ to ¹⁄₁₀ or less its thickness. Also, it is preferable that the spacing of the mask material be made ½ to ¹⁄₁₀ or less of the combined thickness of its thickness and the thickness of the material to be etched directly beneath the region of the spacing.

Also, it is preferable that the spacer material be etched using an etching gas that accumulates very little etching substances and has good anisotropic properties. The lower electrode is preferably connected to the diffusion region of the memory cell section through a contact hole.

In version 3 the plurality of screen capacitors on top of the semiconductor substrate are arranged at prescribed intervals, and along with these respective screen capacitors being formed by a cylindrical lower electrode, dielectric film, and upper electrode with an inverted frustum shape, it is preferable that the spacing in the alignment direction be kept smaller than the outer diameter of the lower electrode.

Also, the outer surface of the lower electrode is almost flat from its lower edge to its upper edge, the inner surface of the lower electrode is almost flat from its lower edge to a position midway to the upper edge, and the film thickness can be kept thin from the midway position to the upper edge. The lower electrode is preferably connected to the diffusion region of the memory cell through contact holes.

In version 4, when manufacturing semiconductor devices wherein a number of screen capacitors are placed at a prescribed interval on semiconductor substrate, and along with these screen capacitors being respectively formed by a cylindrical lower electrode, dielectric film, and upper electrode with an inverted frustum shape, the spacing in the alignment direction is smaller than the inner diameter of the lower electrode, it is preferable to make it a manufacturing method consisting of a process wherein spacer material for regulating the shape of the screen capacitors is formed on the semiconductor substrate; a process wherein a number of first mask materials are formed by positioning them at prescribed intervals and aligning them on the spacer material, and at this time, the spacing in the alignment direction is less than the diameter and thickness of the mask materials; a process wherein the spacer material is etched using the first mask materials, the spacer material directly beneath the region of the spacing is selectively removed and divided into multiple units, and the inner diameter of the lower electrode is regulated by each spacer material; a process wherein a structural material layer of the lower electrode is adhered to a surface of the spacer material; a process wherein a second mask material is filled between the separated number of spacer materials to a height less than the upper surface of the spacer material; a process for etching the structural material layer that is exposed on the upper surface and in the vicinity of the spacer material; a process for removing the second mask material and leaving the structural material layer on the side surfaces of the spacer material; a process for removing the spacer material and forming the lower electrode; a process for forming the dielectric film on a surface of the lower electrode; and a process for forming the upper electrode on a surface of the dielectric film.

Also, it is preferable that the diameter of the unmasked region of the spacer material for the spacing of the first masked material be made equal to or greater than, and less than 10 times, the thickness of this first mask material.

Also, it is preferable that the diameter of the unmasked region of the spacer material for the spacing of the first masked material be made equal to or greater than, and less than 10 times, the combined thickness of the thickness of this first mask material and the thickness of the material to be etched directly beneath the region of the spacing.

Also, it is preferable that the lower electrode connect to the diffusion region of the memory cell section through a contact hole.

In the Inventions 5 and 6 of our invention, it is preferable that a method for manufacturing the semiconductor device like that presented in the Inventions 1 and 3 and in the embodiment of the invention be used.

BRIEF DESCRIPTION OF DRAWINGS

FIG. 26 is an enlarged cross-sectional view of one processing step of the method for manufacturing a dynamic RAM based on embodiment 4 of our invention.

FIG. 27 is an abbreviated layout of another device used in the manufacturing of this same dynamic RAM.

In the figures, 1 is a silicon substrate, 3 an $n^+$-type source region, 4 an $n^+$-type drain region, 6, 61, 70, and 97 insulating layer, 10 contact hole, 11, 96, 106 polysilicon layer (lower electrode), 77 dielectric film, 78 polysilicon layer (upper electrode), 79 accumulated substance, such as polymers, 80 oxide, 91 silicate glass layer (insulating layer), 92, 102 mask, $W_1$ diameter, $W_2$ spacing, H height or thickness, WL word line, BL bit line, CAP stacked cell capacitor, and MC a memory cell.

DETAILED DESCRIPTION

Figure 1:
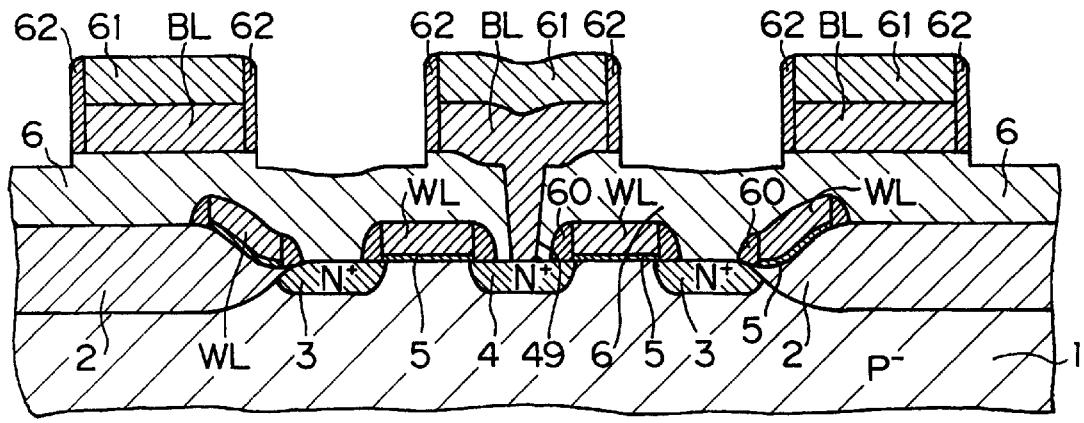
FIG. 1 is an enlarged cross-sectional view of one processing step of the method for manufacturing a dynamic RAM based on embodiment 1 of our invention.

FIGS. 1–17 show an embodiment 1 of our invention wherein our invention is applied to a dynamic RAM. To explain a dynamic RAM as well as its manufacturing processes based on this embodiment, first, as shown in FIG. 1, an element region is provided by a field $SiO_2$ film 2 that was formed by the LOCOS method on top of the p⁻-type silicon substrate 1 in the memory cell section, a gate oxide film 5 is formed in this element region, and on top of this, a polysilicon word line WL, in which a polysilicon nitride side wall 60 is provided, and a $SiO_2$ insulating layer 6 are formed by CVD, and the n⁺-type semiconductor regions 3 (source region) and 4 (drain region) are formed by a self-aligning system using this word line WL as a mask.

The contact hole 49 that extends to the n⁺-type frame region 4 is provided in this insulating layer 6, and bit line BL is adhered and formed. The upper surface of the bit line BL is protected by insulating layer 61, and side wall 62 is provided on its side surface.

Figure 2:
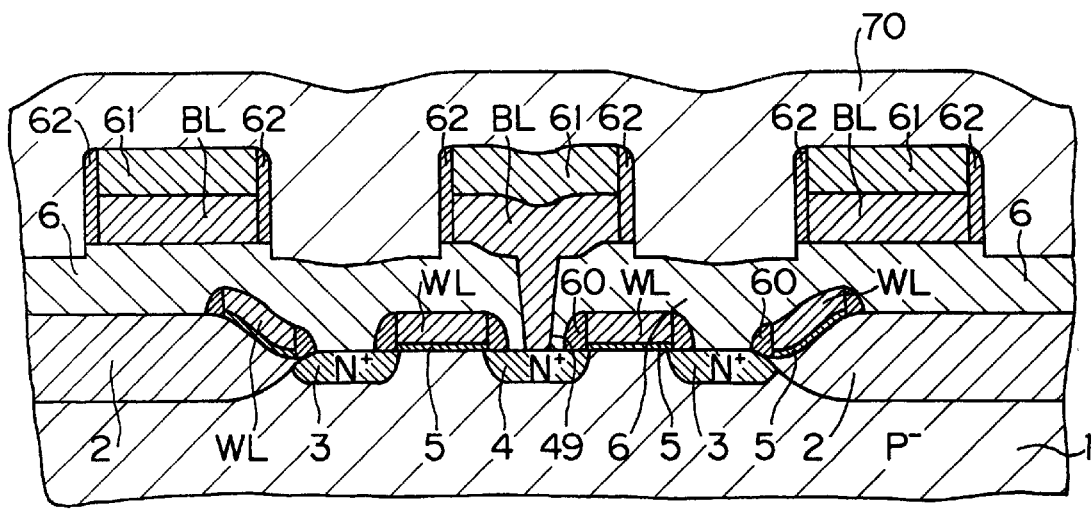
FIG. 2 is an enlarged cross-sectional view of another processing step of this same manufacturing method.
Figure 3:
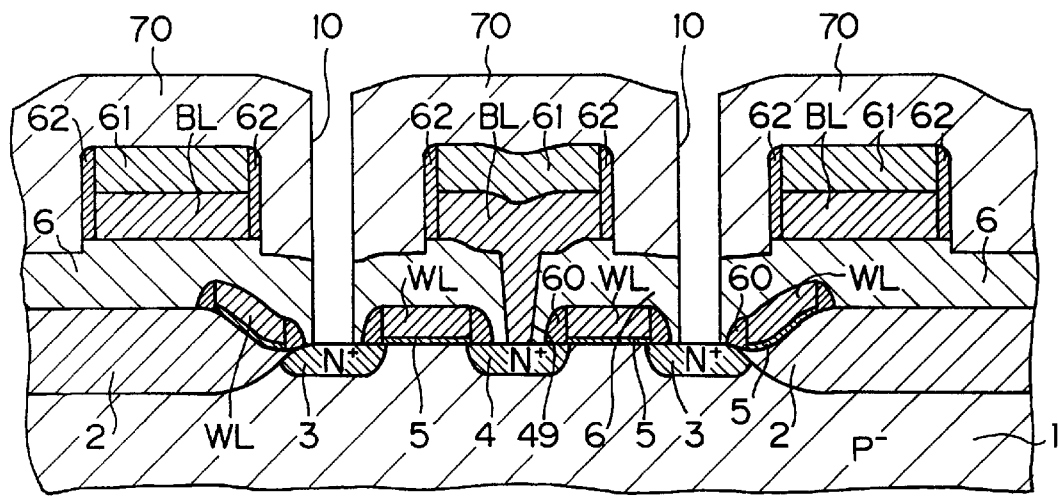
FIG. 3 is an enlarged cross-sectional view of another processing step of this same manufacturing method.

Next, as shown in FIG. 2, an insulating film (containing a phosphosilicate glass layer) 70 of $SiO_2$ or the like is adhered by CVD over the entire surface, then, as shown in FIG. 3, contact hole 10 is formed in a portion of the insulating layers 6 and 70 on top of source region 3.

Figure 4:
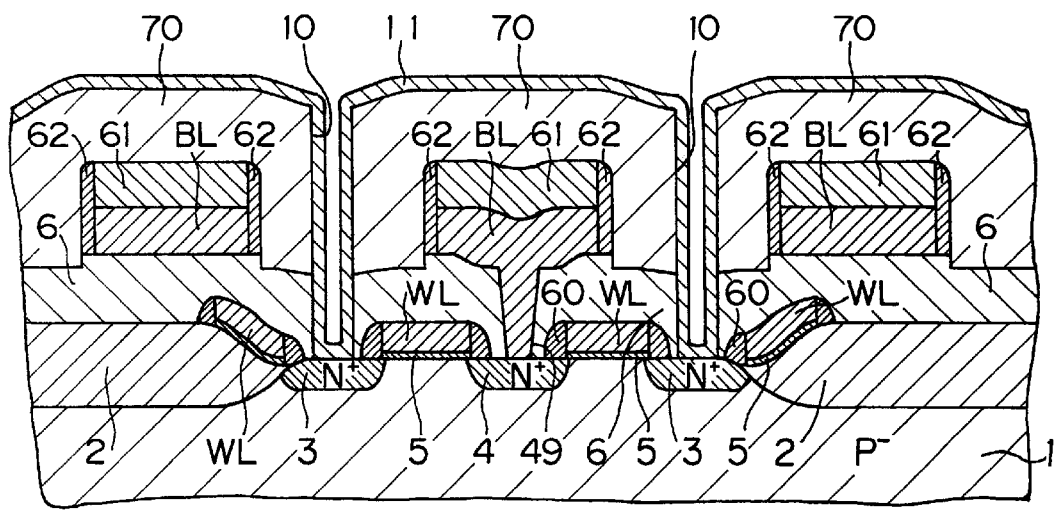
FIG. 4 is an enlarged cross-sectional view of another processing step of this same manufacturing method.
Figure 5:
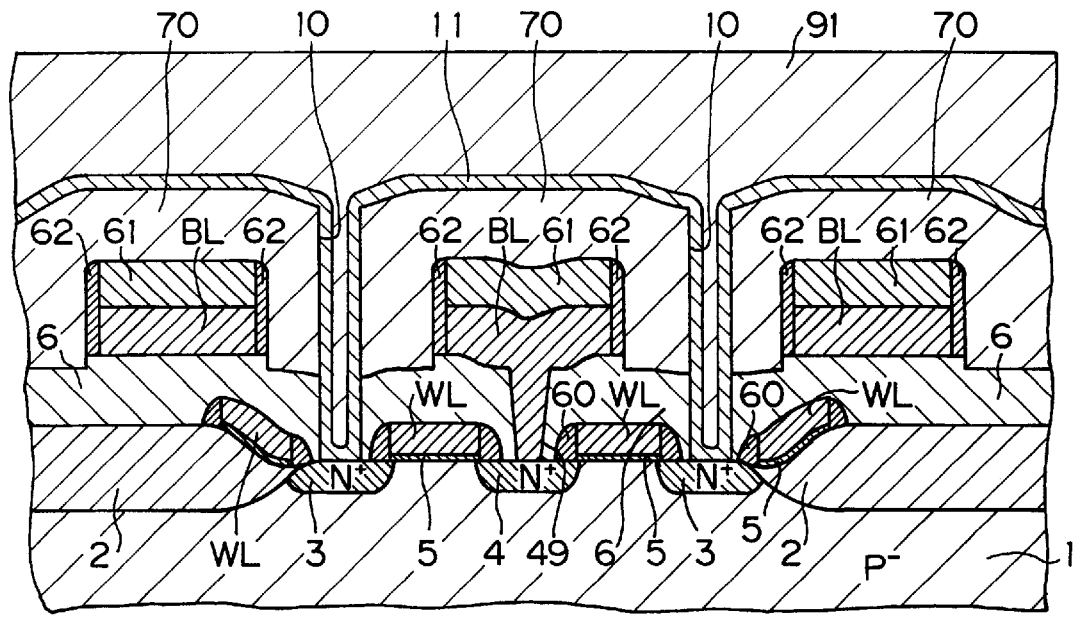
FIG. 5 is an enlarged cross-sectional view of another processing step of this same manufacturing method.

As shown in FIG. 4, the polysilicon layer 11, which forms a portion of the capacitor lower electrode (storage node), is deposited so as to include this contact hole 10 and connect to source region 3 by CVD to a thickness of about 1000 Å. Next, as shown in FIG. 5, an oxide insulating film 91 that is made of a phosphosilicate glass that acts as a support pillar (or is used as a spacer for regulating the shape of the polysilicon lower electrode) when of forming the cylindrical (crown-shaped) polysilicon lower electrode for the cylindrical stacked cell capacitor which will be presented later, is formed by CVD to a thickness of, for example, about 5000 Å, on top of this polysilicon layer 11. This phosphosilicate glass insulating layer 91 is made of an undoped silicate glass containing no impurities (however, it can be doped with an impurity depending on the type and concentration of the impurity).

Figure 6:
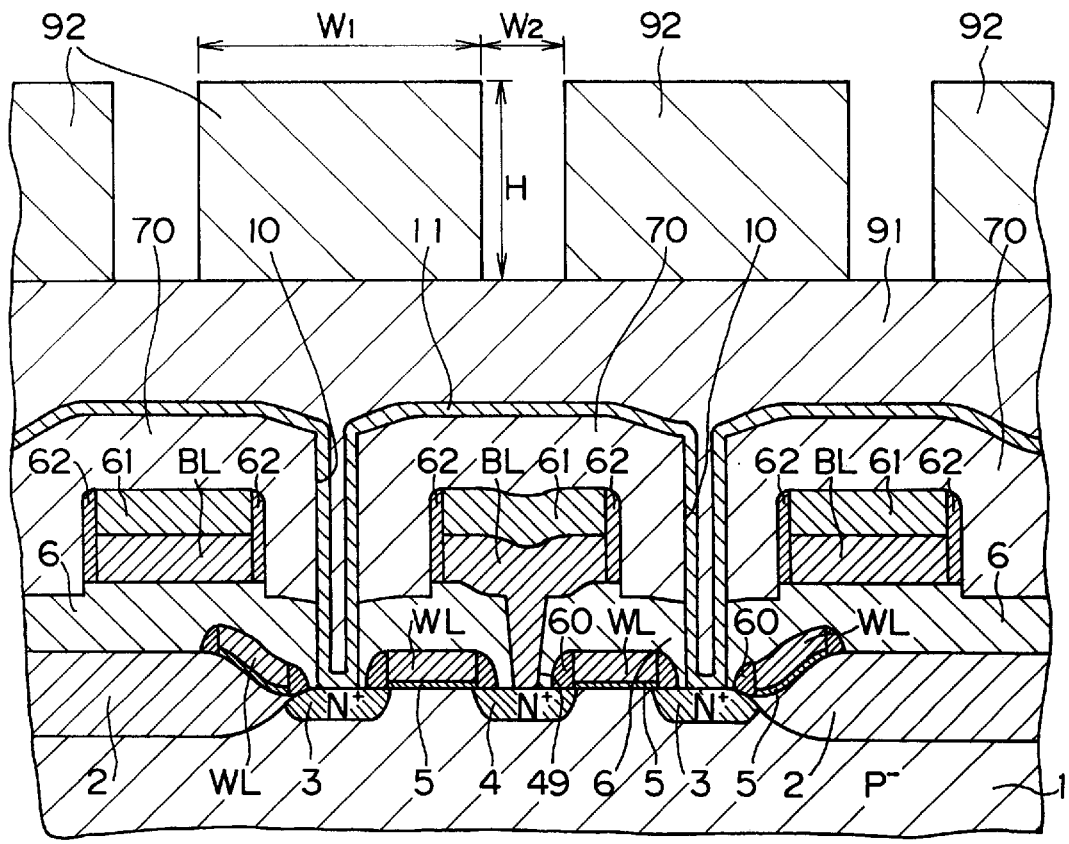
FIG. 6 is an enlarged cross-sectional view of another processing step of this same manufacturing method.

In FIG. 6, photoresist mask 92 for etching the insulating layer 91 into the spacer shapes is formed in the prescribed pattern (in other words, a circular pattern divided into a number of units). In this mask 92, assuming the diameter of each mask is $W_1$, the spacing between each mask is $W_2$, and the thickness of each mask is H, it can be reduced to practice even at about $W_2=0.2$ μm, $H=2.0$ μm, where $W_1>W_2$, preferably $2W_2 \leq W_1 \leq 10W_2$, and the aspect ratio is $W_2/H \leq \frac{1}{2}$ (more specifically, $\frac{1}{10} \leq W_2/H \leq \frac{1}{2}$). For example, $W_1=0.6–1.2$ μm, $W_2=0.2–0.3$ μm, and $H=0.7–1.0$ μm, where $W_2/H$ is 0.3.

Figure 7:
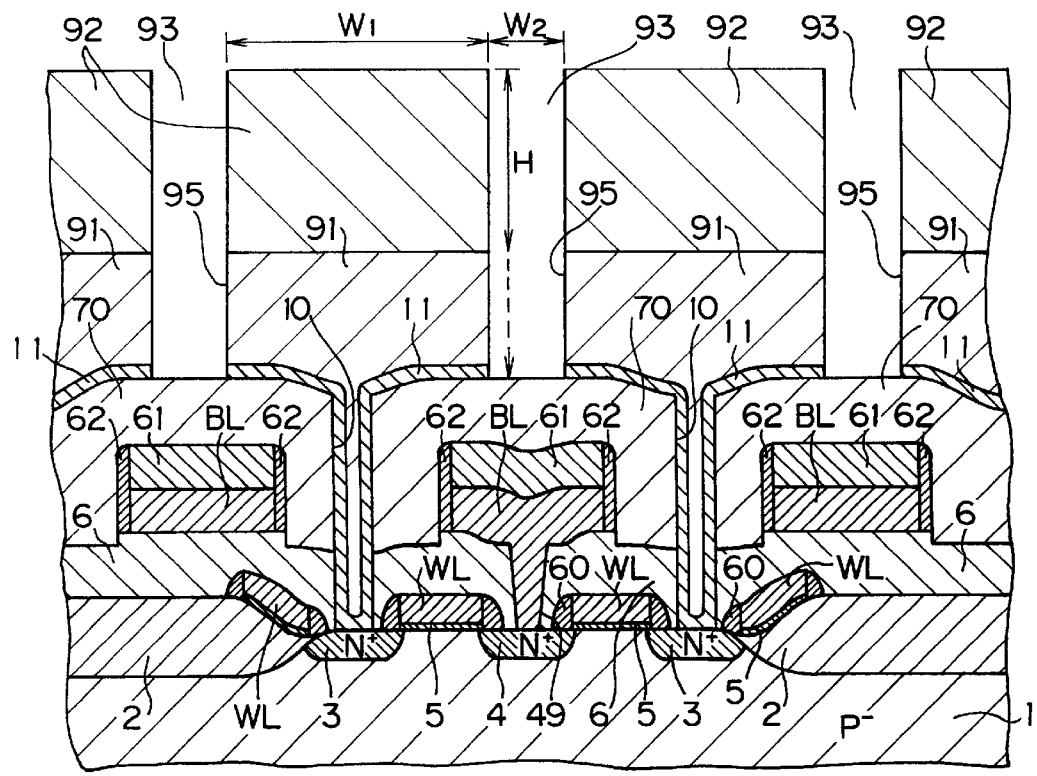
FIG. 7 is an enlarged cross-sectional view of another processing step of this same manufacturing method.

Next, as shown in FIG. 7, insulating layer 91 is dry etched using mask 92, and silicate glass layer 91 is selectively removed directly beneath the unmasked region 93, which is equivalent to spacing $W_2$. As an etching gas for this dry etching, a mixed gas of $CF_4$, $CHF_3$, and Ar, which is isotropic and has selectivity with regard to polysilicon, is used. For example, the etching is conducted with $CF_4$ at 8 sccm, $CHF_3$ at 12 sccm, Ar at 150 sccm, at a pressure of 200 torr, and more than 4.7 W/cm²; however, as shown in the figure, the silicate glass layer 91 is etched perpendicularly to a shape with a perpendicular surface 95.

Figure 14:
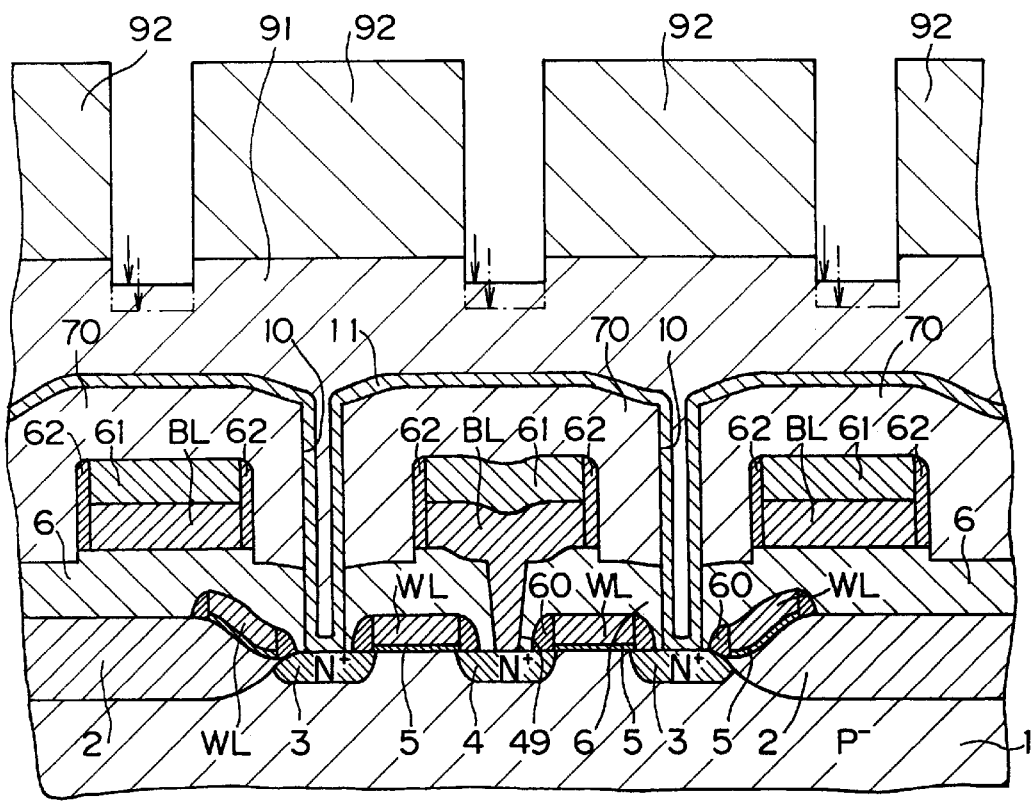
FIG. 14 is an enlarged cross-sectional view for explaining one processing step of this same manufacturing method.

In other words, in FIG. 6, to regulate the size relationships of mask 92 such that $W_1>W_2$, $W_2/H \leq \frac{1}{2}$, width $W_2$ of the unmasked region 93 (window section) wherein glass layer 91 as etched is smaller than the diameter $W_1$ of the remaining portion. The width $W_2$ of the unmasked region 93 is made sufficiently smaller than its height H; therefore, it is difficult for the isotropic etching gas to enter the narrow unmasked region 93, and at the same time that it becomes difficult for the reactive radical of the isotropic etching gas to penetrate, the etching in the perpendicular direction due to the relatively anisotropic etching gas becomes dominant. As a result, during the progress of etching, the accumulated substances, such as polymers, do not adhere to the side walls of glass layer 91, and the etching gas operates only in the almost perpendicular direction in relation to the glass layer 91. In FIG. 14, the etching of the glass layer 91 is indicated by the solid line arrow, and shows a condition in which it advances in the perpendicular direction, as indicated by the broken line arrow.

In this etching, the aspect ratio $W_2/H$ is regulated by the ratio of the spacing of mask 92 to its thickness (height) before etching, but in actuality, the height H becomes greater as the etching progresses, and at the maximum reaches a size equal to the total of the thickness of the mask 92 and the thickness of the glass layer 91. Here, since etching can be carried out until $W_2=0.2$ μm, $H=2.0$ μm, and the thickness of the glass layer 91 is about 1.0 μm, it is preferable that the etching be done until $W_2/H$ at the minimum in particular is about $\frac{1}{16}$ (in the case wherein the total amount is considered), and at a maximum is $\frac{1}{2}$ (before etching). If this $W_2/H$ is greater than $\frac{1}{2}$, the perpendicular etching properties of glass layer 91 become poor, and on the other hand, if it is less than $\frac{1}{16}$, extremely poor etching readily occurs. If this $W_2/H$ is further held to within a range of $\frac{1}{5}$ to $\frac{1}{2}$, a threshold operating effect can be created.

Figure 8:
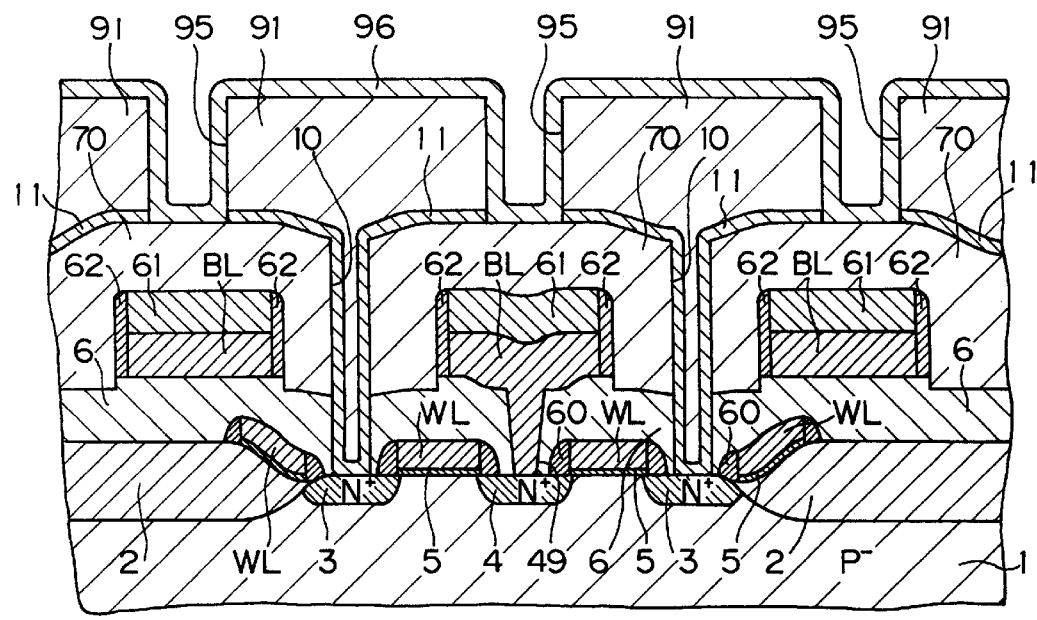
FIG. 8 is an enlarged cross-sectional view of another processing step of this same manufacturing method.
Figure 9:
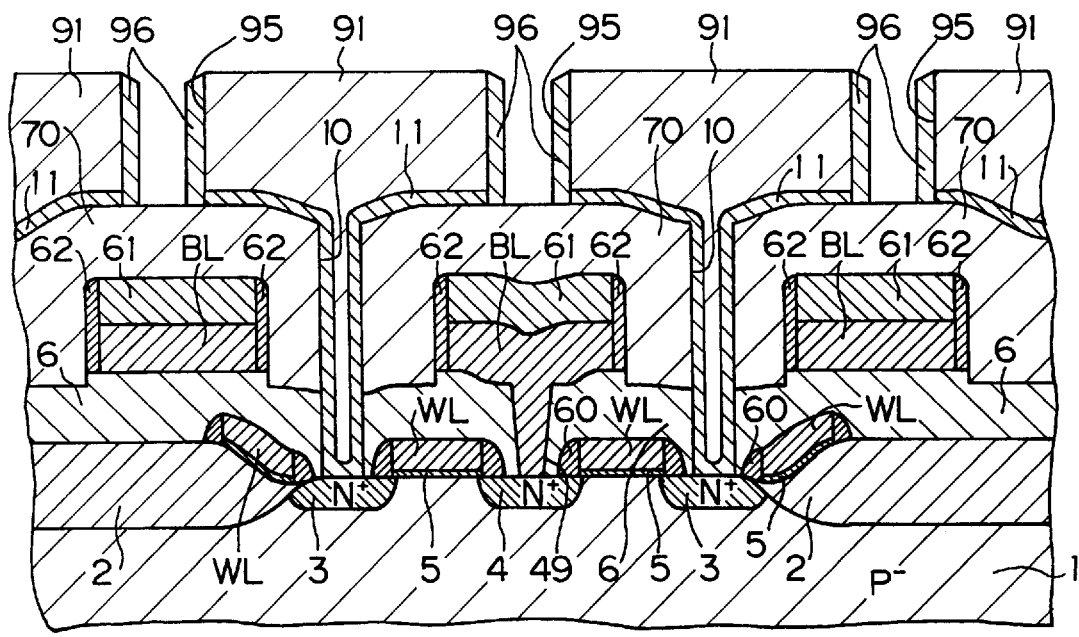
FIG. 9 is an enlarged cross-sectional view of another processing step of this same manufacturing method.

Next, as shown in FIG. 8, mask 92 is removed, and after forming a polysilicon layer 96, which acts as the capacitor lower electrode, over the entire surface by CVD, as shown in FIG. 9, when uniformly etching polysilicon layer 96, in the event that the polysilicon layer 11 of the foundation was not removed by etching before the deposition of the polysilicon layer 96, this polysilicon layer 11 is also etched. Also, polysilicon layer 96 remains on the side surface of spacer material 91. In this etching, a $Cl_2$ gas in which the selectivity is lowered for oxides and has superior anisotropic properties is used. For example, anisotropic etching of the polysilicon layer 96 is conducted with $Cl_2$ at 40 sccm, a pressure of 5 mtorr, and a strength of 180 mA. In this case, to make the side surface of spacer material 91 perpendicular, due to the etching gas operating in a direction perpendicular to the substrate (in other words, at a right angle with substrate 1) for the polysilicon layer 96 on the perpendicular surface, polysilicon layer 96 is uniformly etched, and a sufficient thickness remains on the side surface of spacer material 91.

Figure 10:
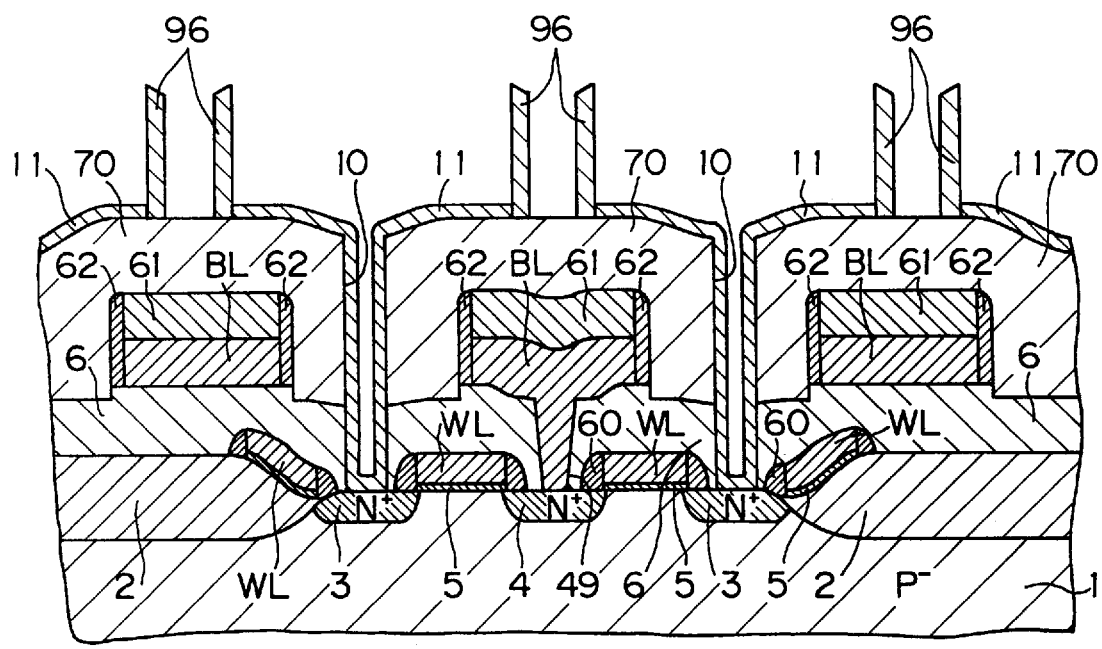
FIG. 10 is an enlarged cross-sectional view of another processing step of this same manufacturing method.

Next, the spacer material 91, which is supported by the side surface of polysilicon 96, as shown in FIG. 10, is removed by wet etching using, for example, fluoric acid (or buffered fluoric acid) having selectivity for polysilicon, and the cylindrical polysilicon lower electrode 96 is formed connected to the n⁺-type region 3 of substrate 1.

Figure 11:
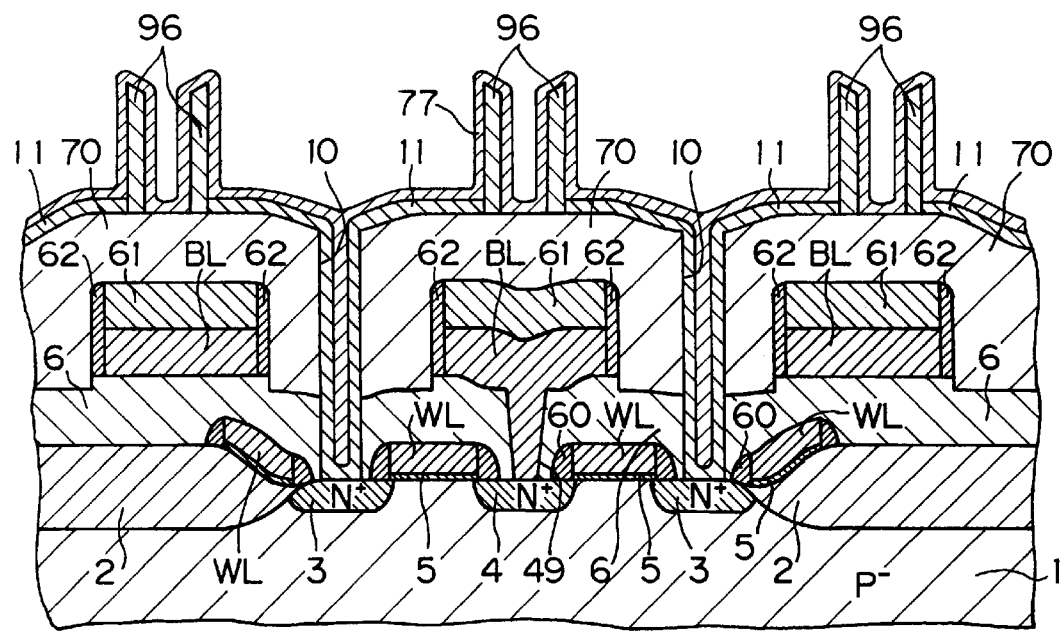
FIG. 11 is an enlarged cross-sectional view of another processing step of this same manufacturing method.
Figure 12:
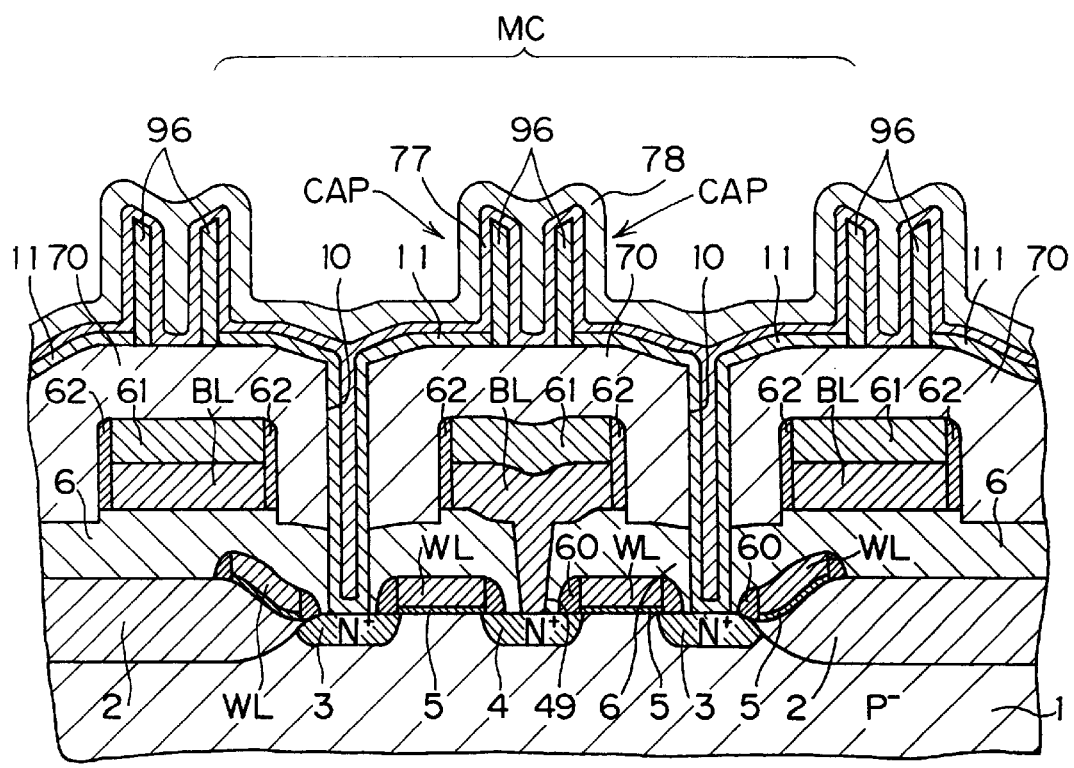
FIG. 12 is an enlarged cross-sectional view of another processing step of this same manufacturing method.
Figure 13:
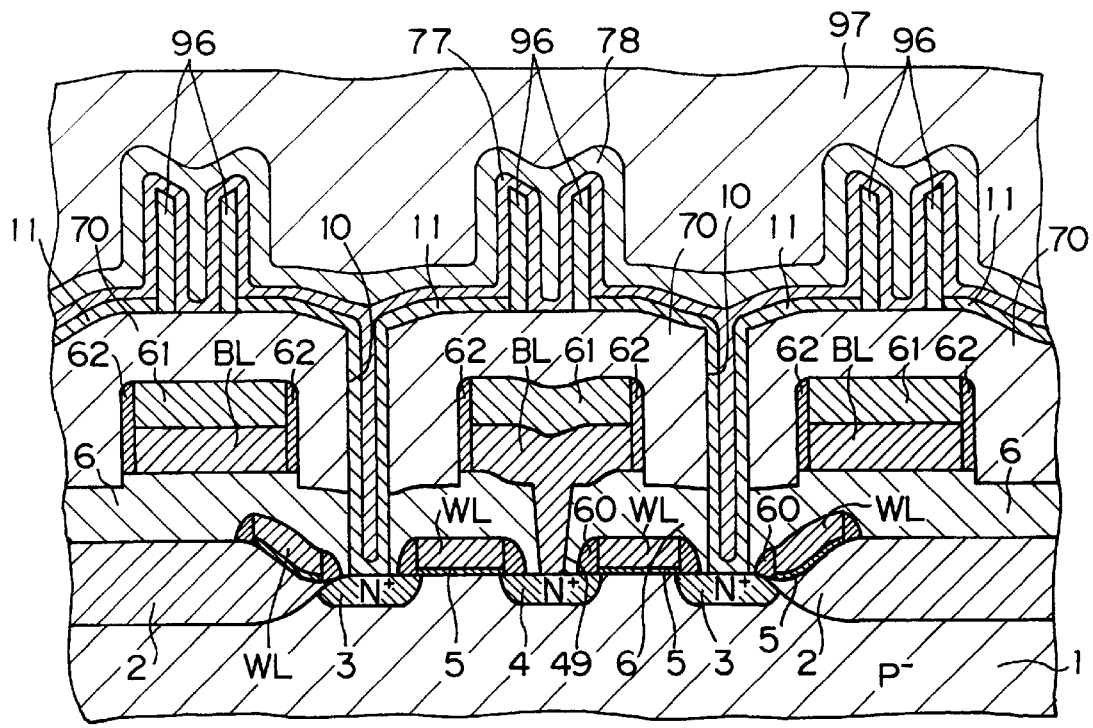
FIG. 13 is an enlarged cross-sectional view of yet another processing step of this same manufacturing method.

Next, as shown in FIGS. 11 and 12, the high dielectric film 77 made of silicon nitride and the capacitor upper electrode (plate electrode) 78 made of polysilicon are respectively accumulated by CVD over the entire surface, and the memory cell MC of a COB construction having mutually separated numerous stacked cell capacitors CAP is manufactured. The top of this memory cell is further covered with insulating layer 97, as shown in FIG. 13.

As mentioned above, the memory cell for the dynamic RAM, as shown by the process for its construction according to this embodiment, has a capacitor lower electrode 96 inner diameter that corresponds to diameter $W_1$ and a spacer between contacting capacitor lower electrodes 96-96 that corresponds to the spacing $W_2$ for mask 92 shown in FIG. 6, and because the lower electrode 96 has a vertical cylindrical shape, the spacer between the connecting capacitors is narrowed and the degree of integration can be increased.

Also, during manufacture, the penetration of the etching gas into the spacing, which is equivalent to the unmasked region 93 of the mask 92 used for patterning the spacer material 91 for regulating the shape of the lower electrode 96, and which becomes the cause of the growth of accumulated substances, does not readily occur, and because perpendicular anisotropic etching can be carried out well in the perpendicular direction, the thickness of the capacitor lower electrode can be kept sufficiently large after etching, and a perpendicular shape can be realized. In other words, the radicals from the etching gas do not readily penetrate into the unmasked region 93, and perpendicular anisotropic etching can be sufficiently carried out. Due to this, the perpendicularity of the side surfaces of spacer material 91 becomes excellent, etching in the horizontal direction is prevented when etching the polysilicon layer 96 to obtain the capacitor lower electrode, and its thickness can be maintained.

As a result, as mentioned previously, there is needed to initially make the thickness of the construction material layer for the lower electrode large to compensate for film thinning, and since the spacing between the capacitors can be made as narrow as possible, a high density device can be realized, and its degree of integration can be increased.

In polysilicon layer 96, due to the etching, its inner surface is made from the lower edge to the upper edge, but its outer perpendicular surface is only perpendicular from the lower edge to a position midway to the upper edge, and in the upper portion from the midway position, the film thickness gradually becomes thinner.

Also, to compensate for the fact that the polysilicon layer 96 is reduced in its height due to etching in the perpendicular direction, if the spacer material 91 is initially made high, the polysilicon layer 96 can sufficiently maintain its height after etching. Also, by sufficiently carrying out etching in the perpendicular direction, the polysilicon, which is made such that it remains in a stepped portion on top of the semiconductor device, can also be completely removed at the same time, and shorts between the elements caused by polysilicon remaining can be prevented.

Figure 15:
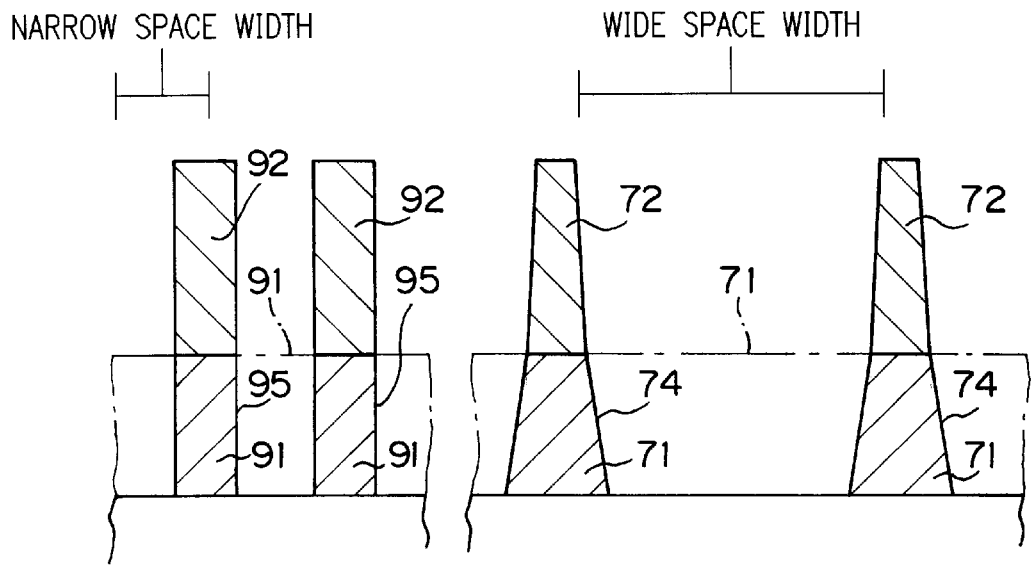
FIG. 15 is an abbreviated cross-sectional view for comparing and explaining one processing step of this same manufacturing method.

In FIG. 15, when using mask 92 with a narrow spacer width $W_2$, which is used in this embodiment, and the mask 72 with a wide space width, since the glass layers 91 and 71, which act as the spacer material, are roughly comparable in shape after being etched, in contrast to the former in which a perpendicular surface 95 is obtained, the latter results in an inclined surface 74, and the thickness of the spacer material becomes large.

Figure 16:
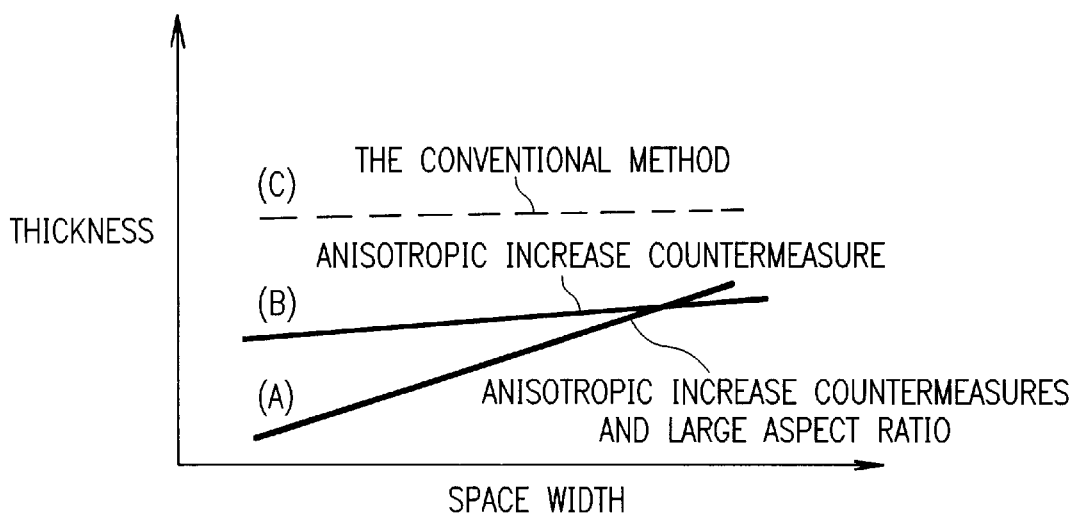
FIG. 16 is a drawing comparing the dimensions after etching in one processing step of this same manufacturing method.

Also, in FIG. 16, as in this embodiment, if the anisotropic properties of the etching gas (for example, if the volumetric flow of $CHF_3$ is reduced) are increased at the same time the aspect ratio ($W_2/H \leq \frac{1}{2}$) of mask 92 is set, as in (A), due to the spacer width (spacing $W_2$) of mask 92, the thickness of the spacer material is reduced after etching, and the perpendicular etching properties can be greatly increased. In the figure, (B) shows the case wherein only the anisotropic properties of the etching gas are increased, but the thickness of the spacer material can be suppressed more than with the conventional method of (C) in the figure (in the case where neither countermeasures (A) or (B) are conducted), and the etching properties are improved by a certain degree.

In other words, with the conventional manufacturing method wherein the anisotropic properties are not improved, the thickness of all of the remaining spacer material remains large in relation to the mask pattern spacing. It is thought that this is because the proportion of the polymers of the etching gas that adhere to the side walls of the etched oxide film is large, and the width of the film is increased. However, for example, if an etching process is used wherein the mixture ratio of the $CHF_3$ is reduced and the anisotropic properties are increased, the increase in width of the film can be suppressed overall. Also, by making the spacing (space) of the mask pattern narrow, increasing the resist film thickness, or increasing the height of the oxide film, the increase in the width of the oxide film can be suppressed by a wide margin.

Figure 17:
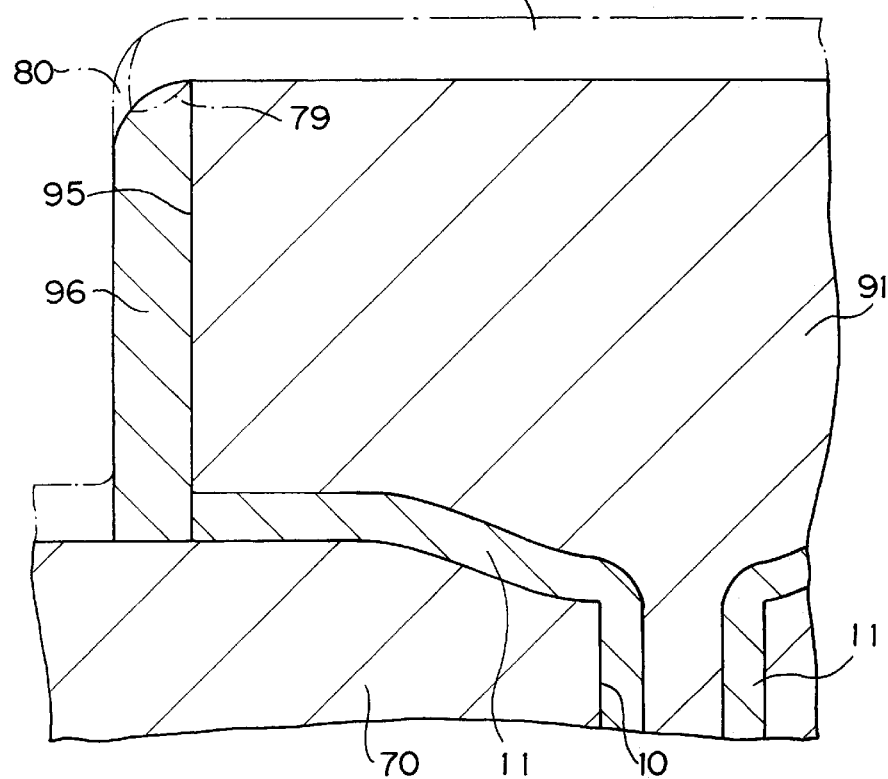
FIG. 17 is a further enlarged cross-sectional view showing an essential element in one processing step of this same manufacturing method.
Figure 36A:
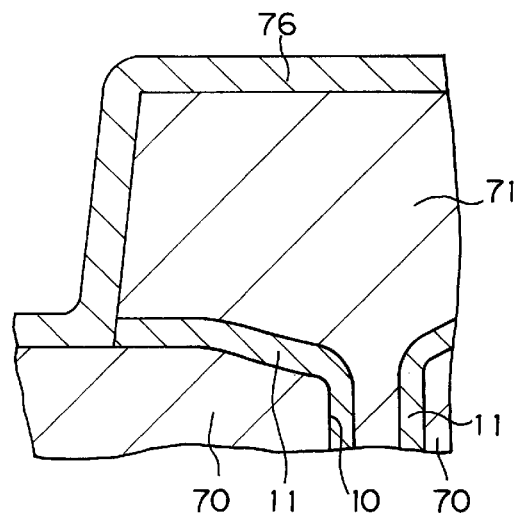
FIGS. 36a–36c are an enlarged cross-sectional view of another processing step of this same manufacturing method.
Figure 36B:
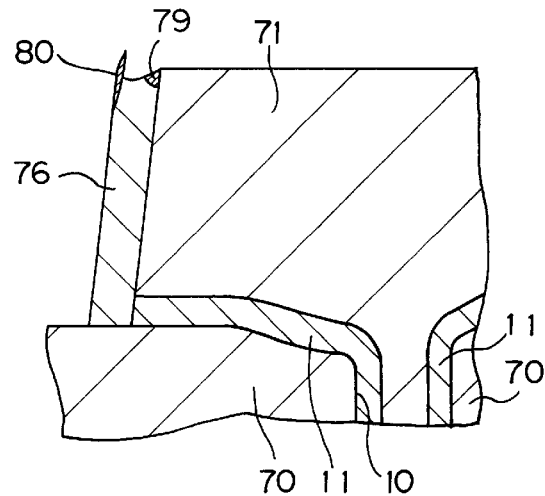
Figure 36C:
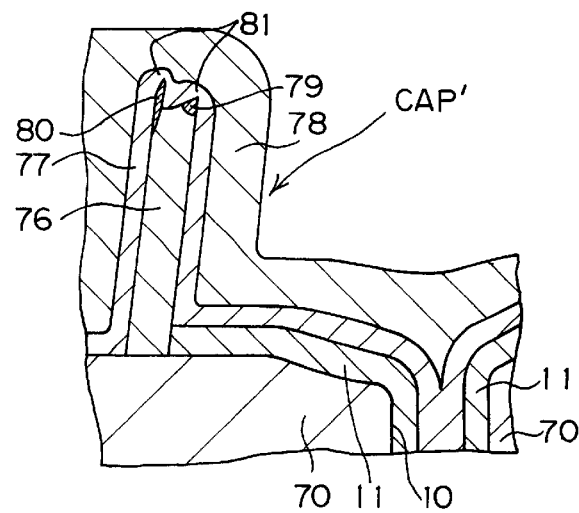

As shown in an enlarged manner in FIG. 17, due to the etching of polysilicon layer 96, as mentioned previously in FIG. 36, polymer accumulated substances 79 are readily accumulated on the inner surface of the top of polysilicon layer 96, and a natural oxide film 80 is readily generated on its outer surface, but it is desirable that these be removed by some method, for example, by etching.

FIGS. 18–24 show embodiment 2 wherein our invention is applied to a dynamic RAM.

Figure 18:
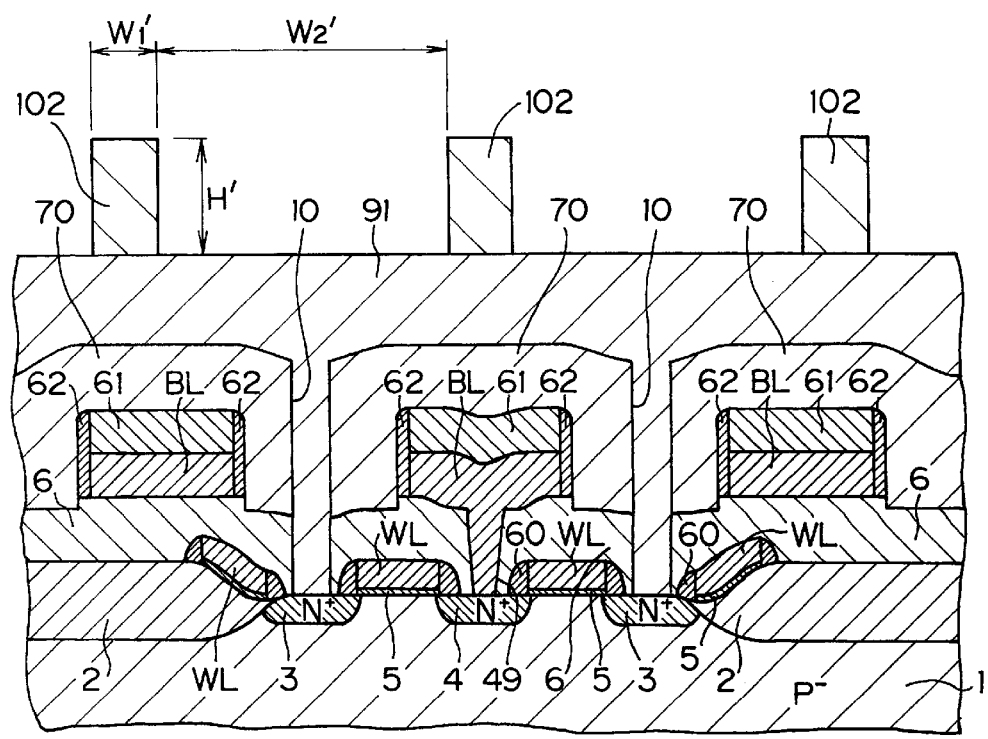
FIG. 18 is an enlarged cross-sectional view of one processing step of the method for manufacturing a dynamic RAM based on embodiment 2 of our invention.

To explain the dynamic RAM based on this embodiment along with its manufacturing process, first, in the same manner as the embodiment 1 shown in FIGS. 1–3, after forming contact holes 10 in one portion of the insulating layers 6 and 70 on top of the source region 3 in the memory cell section, as shown in FIG. 18, a silicate glass layer 91 is formed over the entire surface, including the contact holes 10, by CVD.

This glass layer 91 acts as the support pillar when forming the cylindrical (crown-shaped) polysilicon lower electrode of the cylindrical stacked cell capacitor presented later (or the spacer that regulates the shape of the polysilicon lower electrode), and is formed to a thickness of, for example, 5000 Å. This silicate glass insulating layer 91 is made from an undoped silicate glass that does not contain impurities (however, it can be doped with an impurity, depending on the type and concentration of the impurity).

Then, photoresist mask 102 is formed in the prescribed pattern of etching this insulating layer 91 into the spacer shapes. In this mask 102, the diameter of each mask is set to $W_1'$, the spacing between each mask is set to $W_2'$, and the thickness of each mask is set to H', where $W_1' < W_2'$, preferably such that $1 \times W_1' < W_2' \leq 10 W_1'$, $W_2'/H'^3 1$ (or $2 \leq W_2'/H' \leq 8$). For example, $W_1' = 0.2$–$0.3$ $\mu$m, $W_2' = 0.6$–$1.2$ $\mu$m, $H' = 0.7$–$1.0$ $\mu$m, and $W_2'/H'$ is 1.5.

Figure 19:
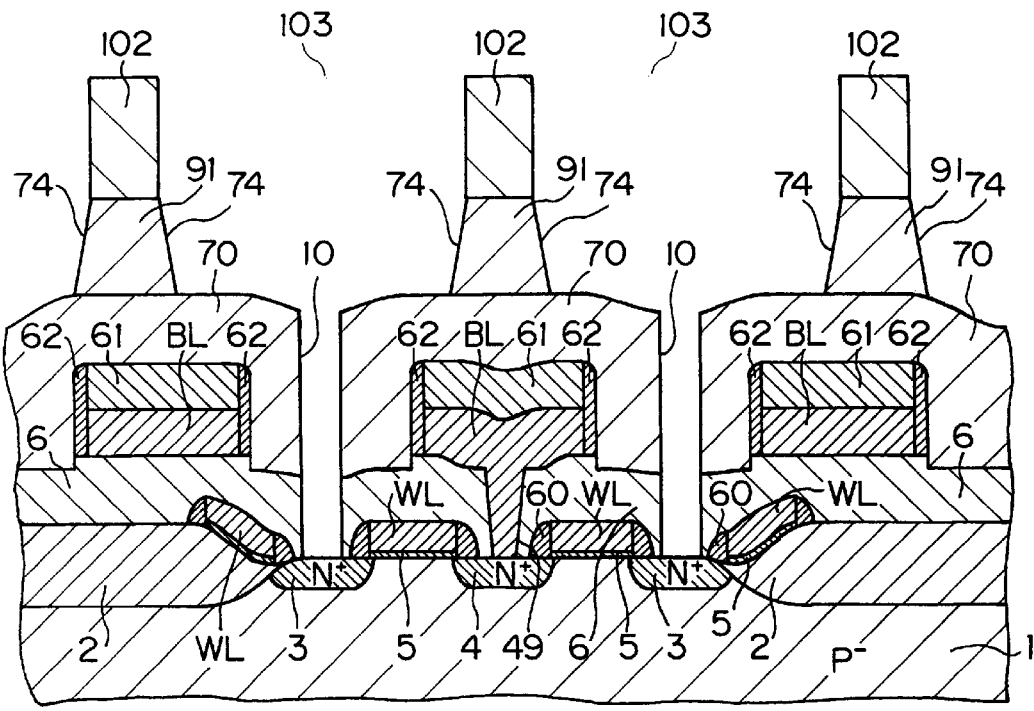
FIG. 19 is an enlarged cross-sectional view of another processing step of this same manufacturing method.

Next, as shown in FIG. 19, insulating layer 91 is dry etched using mask 102, and the silicate glass layer 91 is selectively removed directly beneath the unmasked region 103 that is equivalent to the outer diameter of the capacitor lower electrode. As an etching gas for this dry etching, a mixed gas of $CF_4$, $CHF_3$, and Ar that has a selectivity with regard to polysilicon and is anisotropic, is used. For example, the etching is carried out with $CF_4$ at 5 sccm, $CHF_3$ at 15 sccm, Ar at 200 sccm, at a pressure of 400 mtorr, and a strength of 4.7 W/cm$^2$, but as shown in the figure, the silicate glass layer (91) is etched to a shape having slanted surfaces 74.

In other words, because the size relationship of mask 102 in FIG. 18 is set such that $W_1' \ll W_2'$, and $W_2'/H' \geq 1$, the width $W_2'$ of the unmasked region 103 (opening section) is much larger than the diameter $W_1'$ of the remaining section of the etched glass layer 91, the width $W_2'$ of the unmasked region 103 is also larger than its height H'; therefore, the anisotropic etching gas readily enters the wide unmasked region 103, and at the same time that the reactive radicals of the gas are readily able to penetrate, etching is also carried out in the perpendicular direction due to the isotropic properties of the etching gas. As a result, the accumulated substances, such as polymers, adhere to the side surfaces of the glass layer 91 as etching progresses, and the etching gas does not readily act in the nearly perpendicular direction in relation to the glass layer 91.

Therefore, in this case, the mask 102 is made to a pattern that is opposite that of embodiment 1 shown in FIG. 7, and to make the opening section 103 of mask 102 wide, in the same manner as in the past, the side surfaces of the spacer material 91 do not become perpendicular, but become slanted, and the etching portions of the spacer material 91 are basically different in that these are used as the region for the capacitor lower electrode, as mentioned below.

Figure 20:
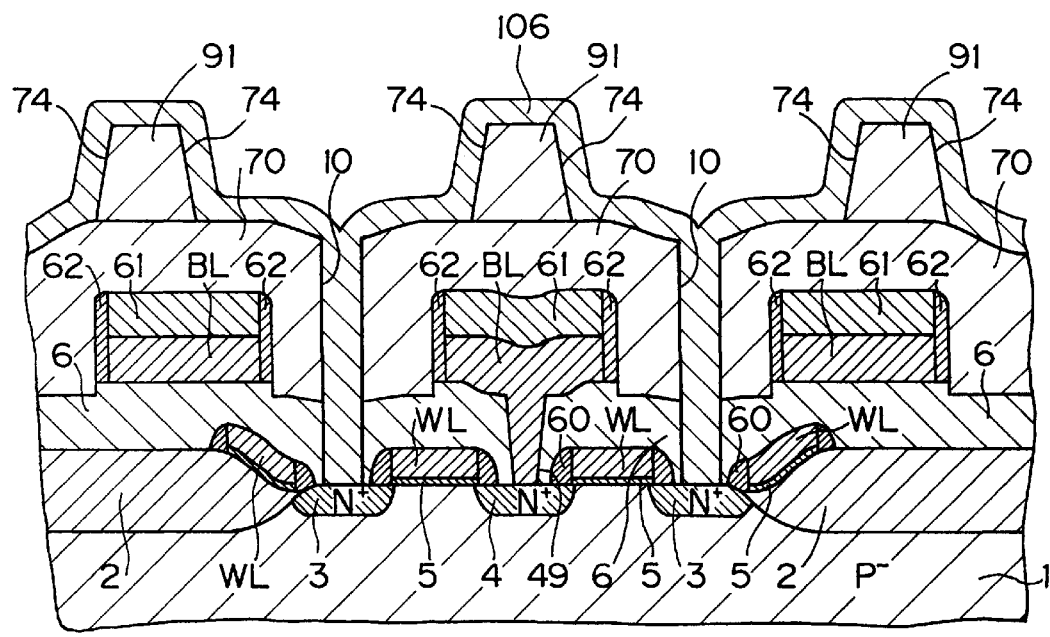
FIG. 20 is an enlarged cross-sectional view of another processing step of this same manufacturing method.

As shown in FIG. 20, mask 102 is removed, and a polysilicon layer 106 is adhered over the entire surface, including the exposed contact holes 10, by CVD.

Figure 21:
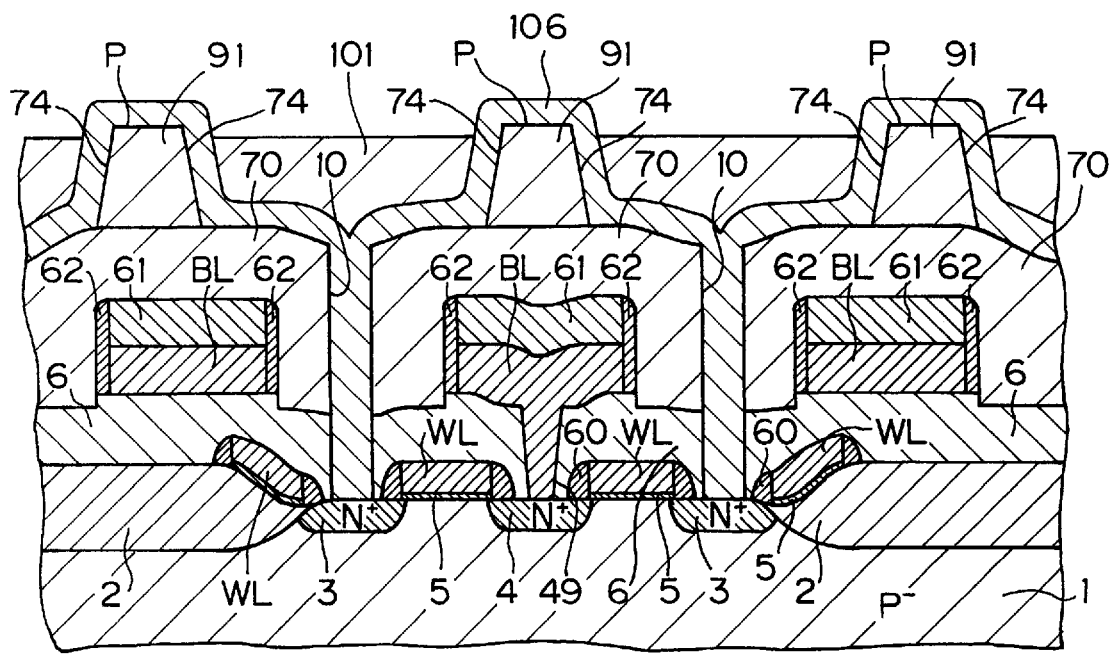
FIG. 21 is an enlarged cross-sectional view of another processing step of this same manufacturing method.

Next, as shown in FIG. 21, a photoresist 101 is filled into cavities 100 between contacting spacer material 91-91 to which the polysilicon layer 106 has adhered to a depth below position (P) on the upper surface of spacer material 102.

Figure 22:
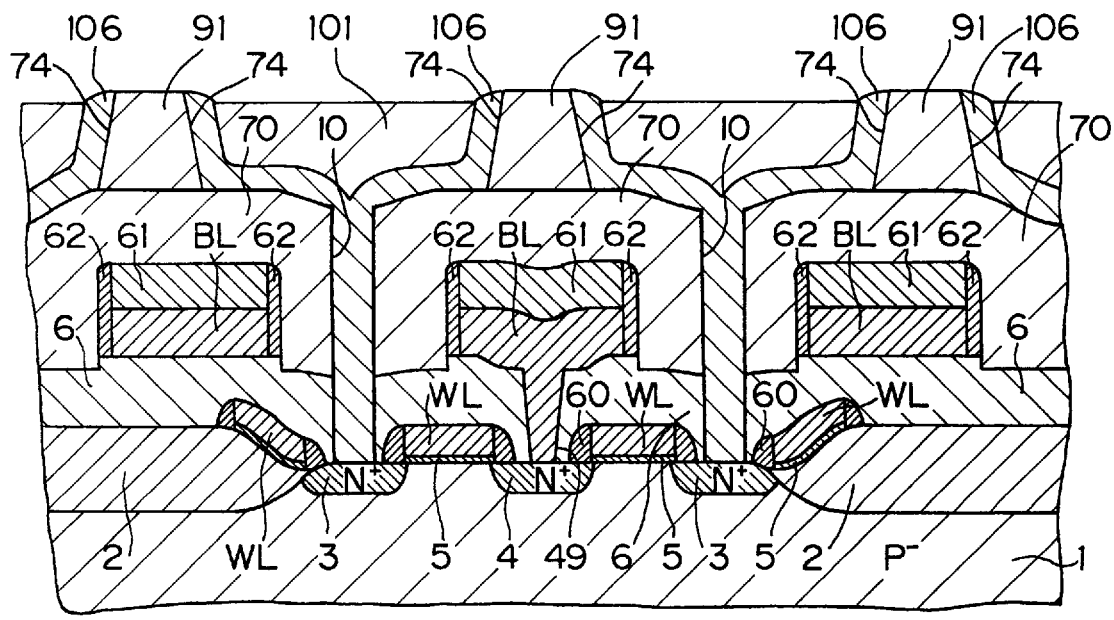
FIG. 22 is an enlarged cross-sectional view of another processing step of this same manufacturing method.

Next, as shown in FIG. 22, using photoresist (101) as a mask, the polysilicon layer 106 that is exposed in the unmasked region is etched. In this etching, a $Cl_2$ gas with superior isotropic properties and in which the selectivity for oxides is lowered is used, for example, anisotropic etching is carried out on polysilicon layer 96 with $Cl_2$ at 40 sccm, a pressure of 5 mtorr, and a strength of 180 mA. In this case, because the side surfaces of spacer material 91 become slanted surfaces, the thickness of the polysilicon layer 106 readily becomes thin due to the etching, but because the polysilicon layer 106 is protected at the side surfaces of spacer material 91 by the resist 101, the thickness is sufficiently maintained after etching.

Figure 23:
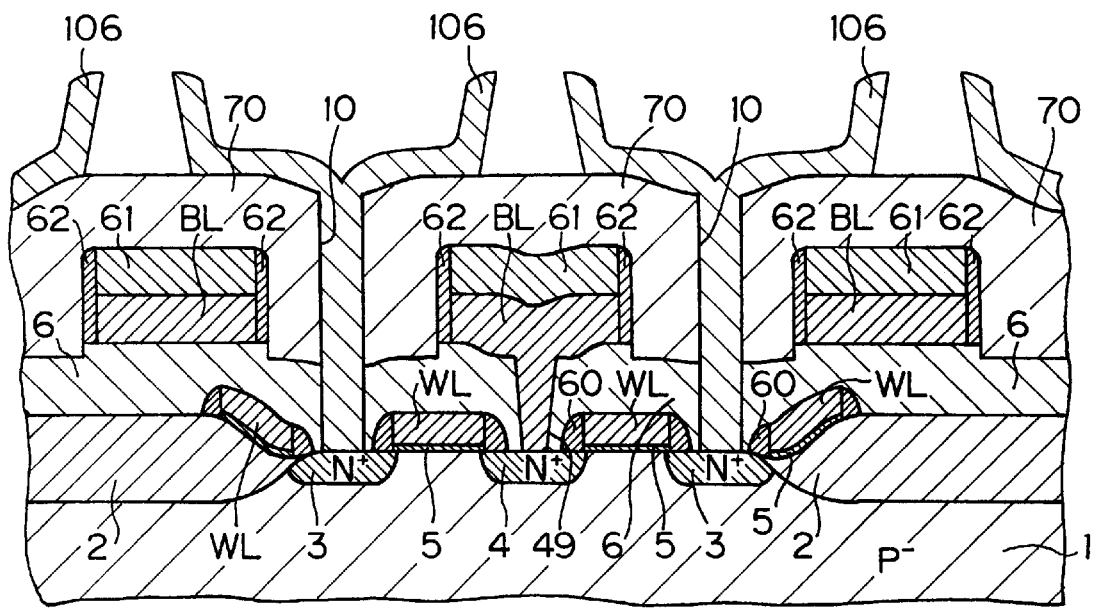
FIG. 23 is an enlarged cross-sectional view of another processing step of this same manufacturing method.

Next, as shown in FIG. 23, resist 101 is removed, the spacer material 91 that supports polysilicon 106 at the side surfaces is removed by wet etching using, for example, fluoric acid (or buffered fluoric acid) with a selectivity with regard to polysilicon, and the cylindrical polysilicon lower electrodes 106 are formed connected to the n$^+$-type region 3 of substrate 1.

Figure 24:
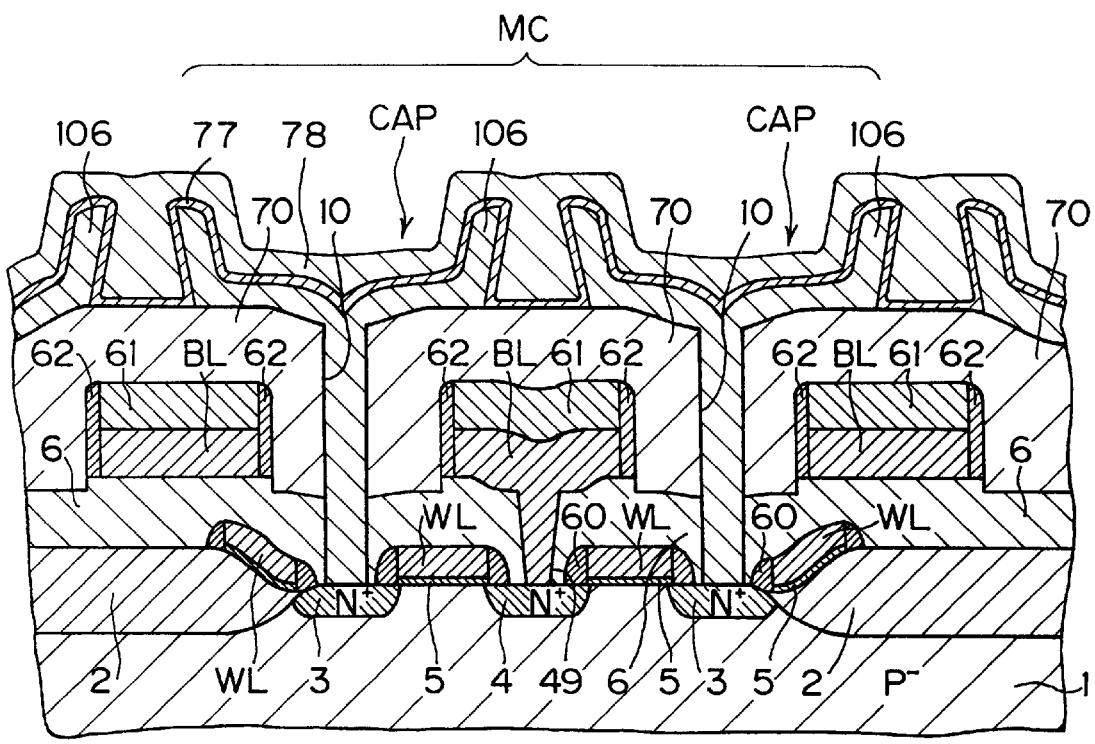
FIG. 24 is an enlarged cross-sectional view of yet another processing step of this same manufacturing method.

Next, as shown in FIG. 24, a high dielectric film 77 made of silicon nitride and the capacitor upper electrode (plate electrode) 78 made of polysilicon are respectively laminated over the entire surface by CVD, and memory cells MC are manufactured with a large number of mutually separated stacked cell capacitors CAP.

As mentioned above, because the memory cell of a dynamic RAM based on this embodiment was shown by its manufacturing processes, and since the upper diameters of the capacitor lower electrodes 106 correspond to diameter $W_2'$ and the space between the connecting capacitor lower electrodes 106-106 correspond to spacing $W_1'$ of the unmasked region for the mask 102 shown in FIG. 18, even though the lower electrode 106 takes on cylindrical shape with an inverted frustum shape, the space between adjacent capacitors are narrowed, and the degree of integration can be increased.

Also, within the diameter $W_2'$ equivalent to the unmasked region 93 of the mask 92 used in the patterning of the spacer material 91 that regulates the shape of the lower electrode 106 during manufacture, even though the spacer material 91 is etched in a slanted manner by the penetration of the etching gas, which causes a growth of accumulated substances during the etching of polysilicon layer 106, the polysilicon layers 106 of the side surfaces of spacer material 91 are not etched due to the resist 101, and its thickness can be maintained.

As a result, there is no need to initially make the thickness of the structural material layer for the lower electrode large to prevent thinning of the film as mentioned previously, and since the spacing between the capacitors can be made as thin as possible, a high density device can be realized, and its degree of integration can be increased.

In polysilicon layer 106, its upper side surfaces are flat from the lower edge to the upper edge due to the etching, but its inner surfaces are flat from the bottom edge to a position midway to the upper edge, and the film thickness of the portion above the midway position becomes gradually thinner.

Figure 25A:
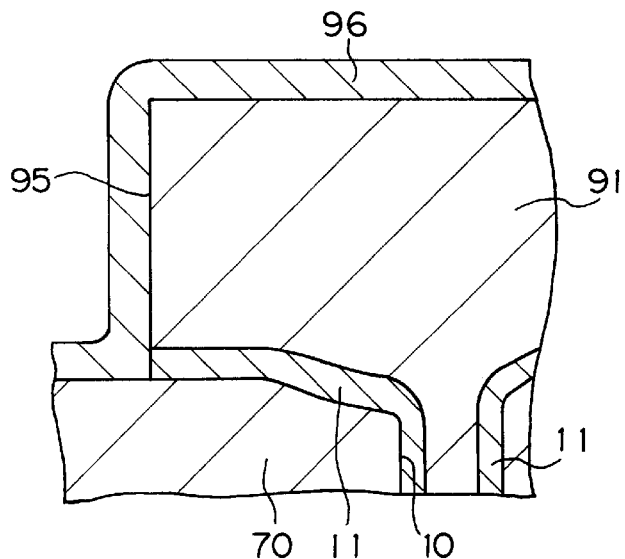
FIGS. 25A–25C is an enlarged cross-sectional view of one processing step of the method for manufacturing a dynamic RAM based on embodiment 3 of our invention.
Figure 25B:
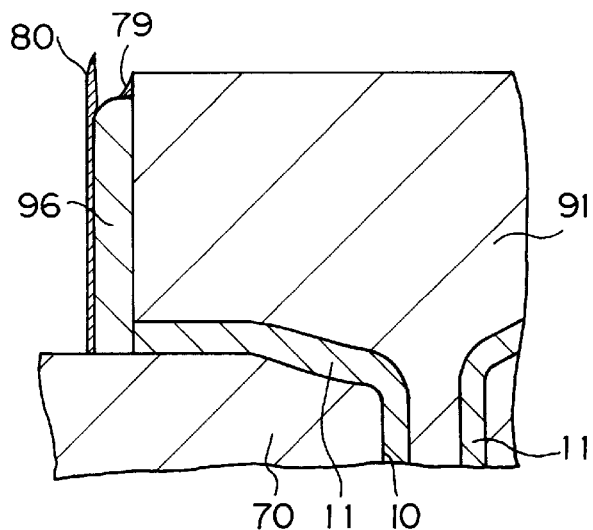

FIG. 25 shows embodiment 3 wherein our invention is applied to a dynamic RAM.

In the process for manufacturing a dynamic RAM based on this embodiment, the process that is different from those of the embodiments is that, during the etching of the polysilicon layer that becomes the capacitor lower electrode, the generation of burrs that tend to be generated on the top of the polysilicon layer is prevented.

In other words, as shown in FIG. 25(A), after adhering the polysilicon layer 96 on top of spacer material 91 by CVD, if the polysilicon layer 96 is etched as is, the above mentioned accumulated substance 79, such as a polymer, and the natural oxide film 80 readily grow on its top section. There are instances where the burrs of polysilicon originating in these are formed to a height of about 800 Å.

Thus, as an etching condition for the polysilicon layer 96, by carrying out the etching using an etching gas wherein the selectivity for the oxide film is lowered and which has a slight anisotropic etching component, the generation of burrs can be prevented.

Specifically, as an etching gas that is used, to lower the selectivity in relation to the oxide film, $Cl_2$ is used without using $O_2$. With a mixed gas of $Cl_2$ and $O_2$, the etching ratio of polysilicon:oxide is >>50:1, but when only $Cl_2$ is used, the ratio becomes about 20:1, and the oxide can also be etched while sufficiently carrying out perpendicular etching as the polysilicon. Also, as an anisotropic component, $SF_6$ can also be mixed in. Therefore, in this embodiment, the etching gas used for etching, as one example, is a mixed gas of $Cl_2$ at 40 sccm and $SF_6$ at 4 sccm, and the etching is done at a pressure of 5 mtorr and a strength of 200 mA.

Figure 25C:
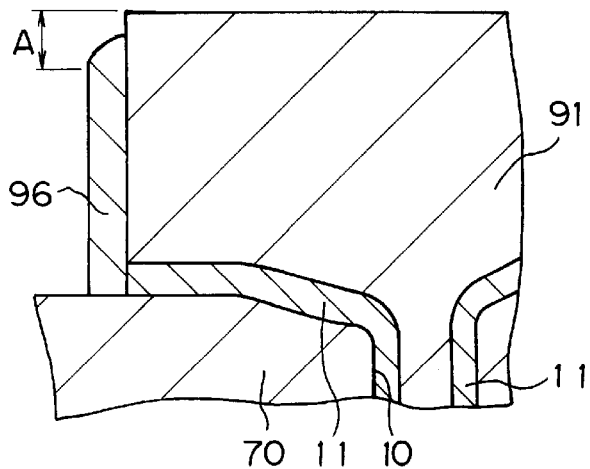
Figure 28:
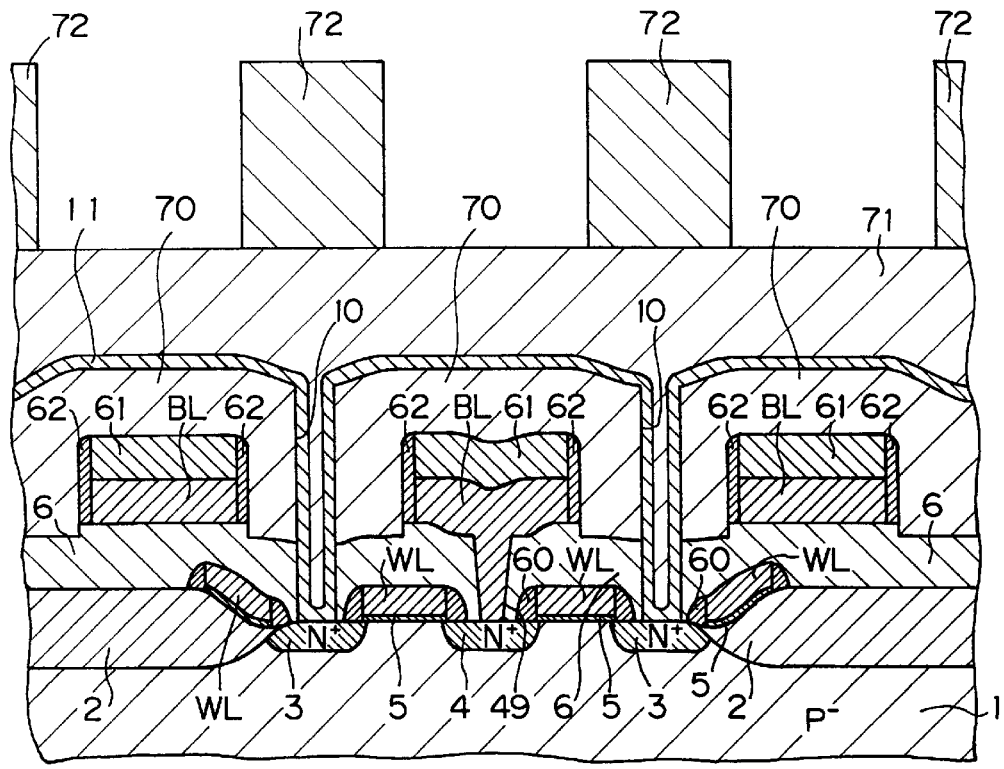
FIG. 28 is an enlarged cross-sectional view of one processing step of a method for manufacturing a dynamic RAM based on a conventional example.
Figure 29:
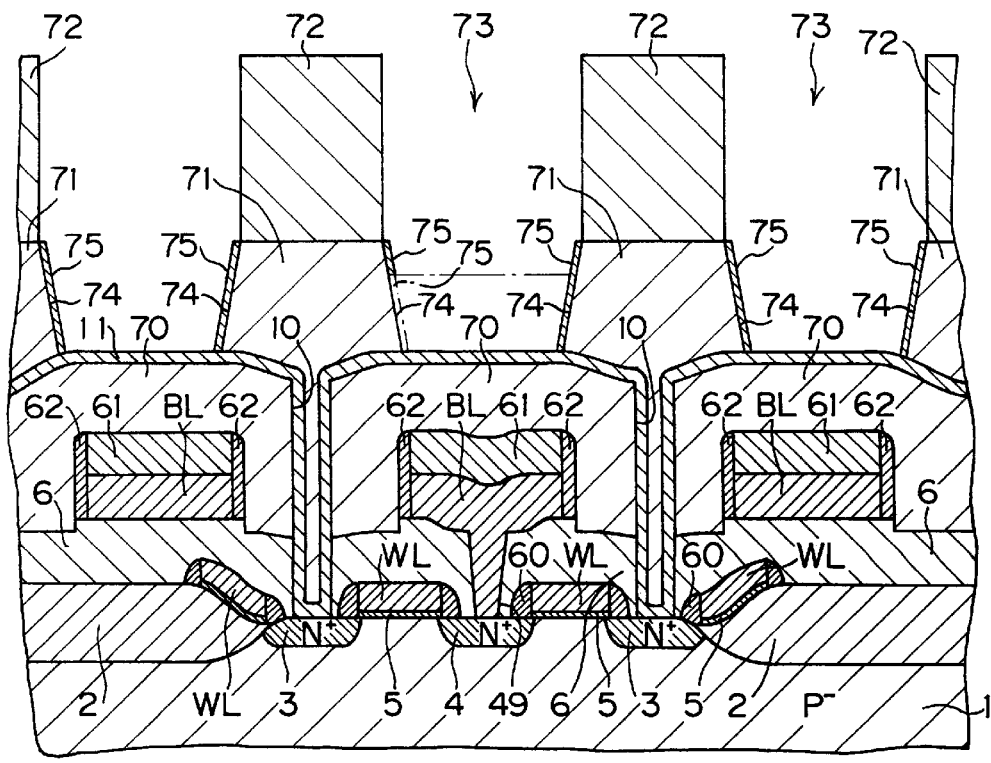
FIG. 29 is an enlarged cross-sectional view of another processing step of this same manufacturing method.
Figure 30:
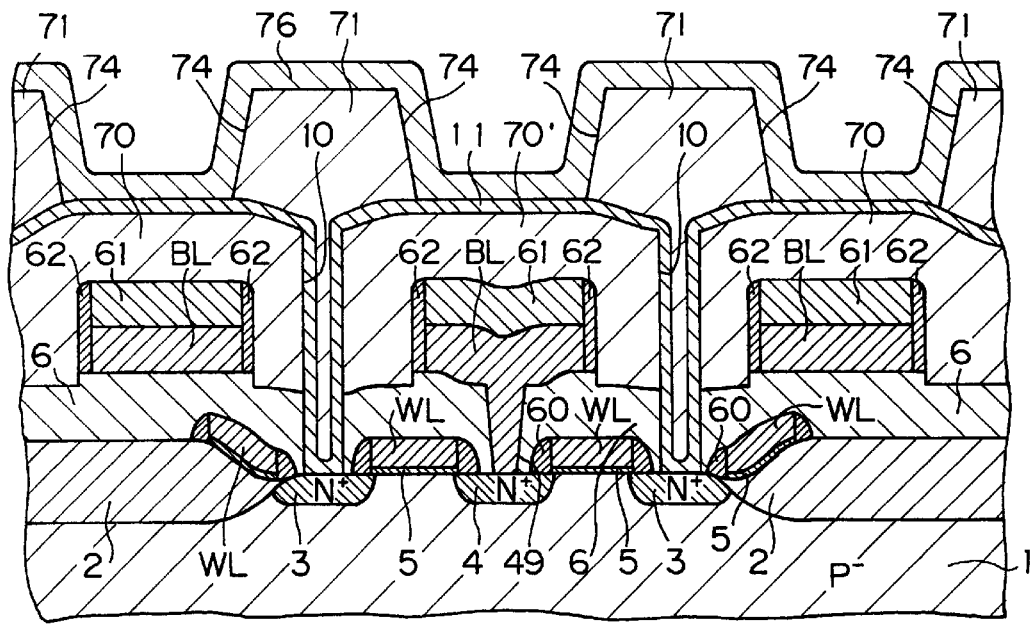
FIG. 30 is an enlarged cross-sectional view of another processing step of this same manufacturing method.
Figure 31:
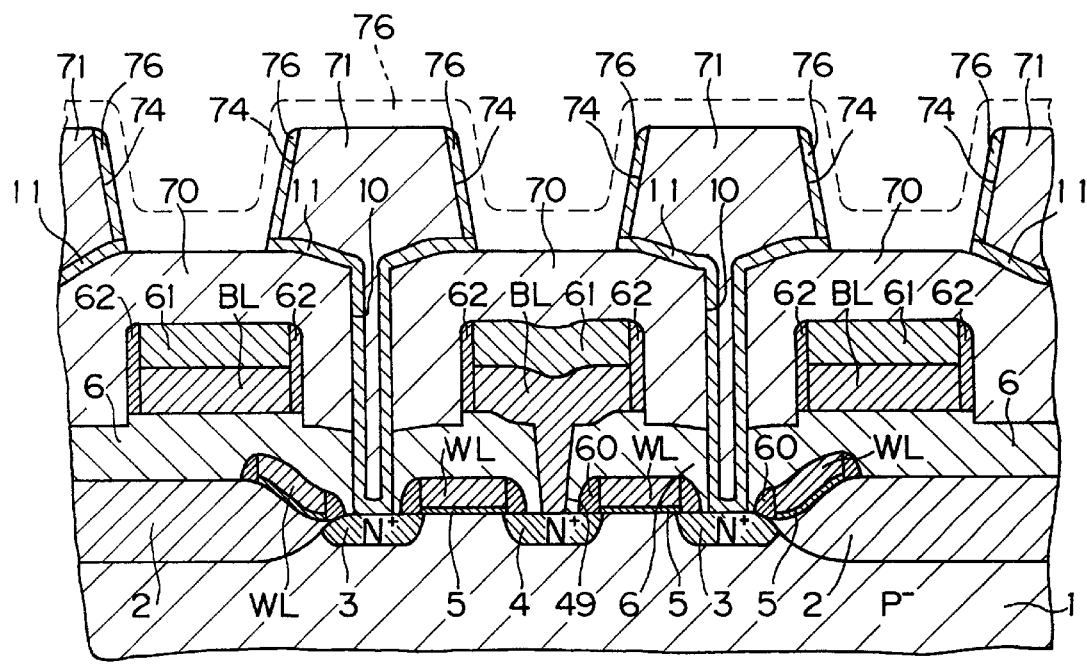
FIG. 31 is an enlarged cross-sectional view of another processing step of this same manufacturing method.
Figure 32:
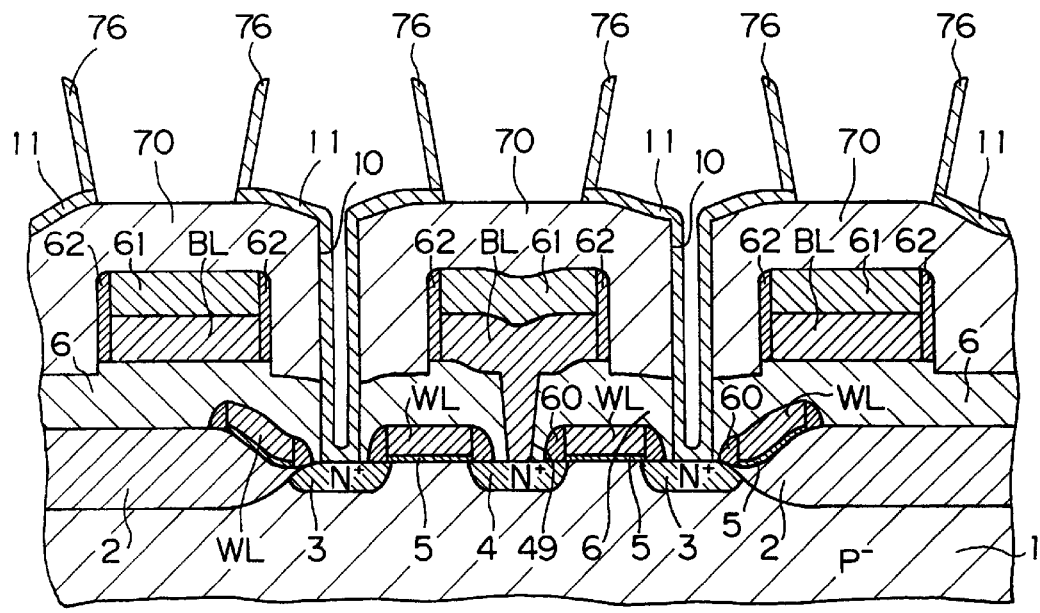
FIG. 32 is an enlarged cross-sectional view of yet another processing step of this same manufacturing method.
Figure 33:
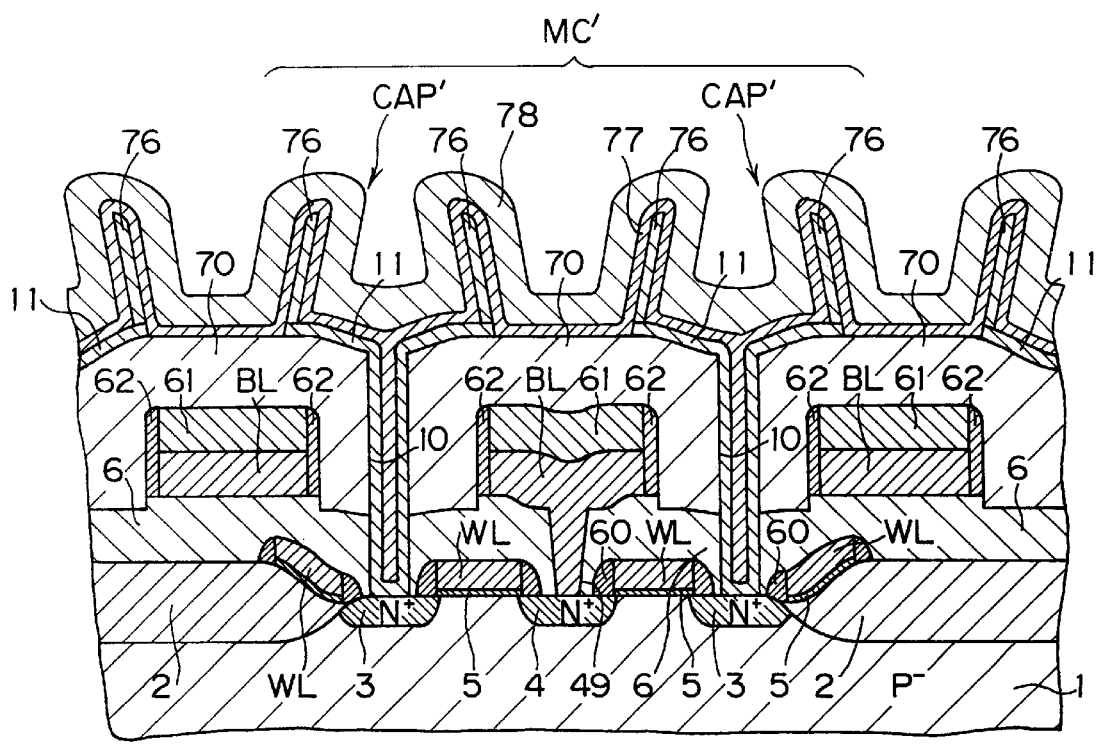
FIG. 33 is an enlarged cross-sectional view of another processing step of this same manufacturing method.
Figure 34:
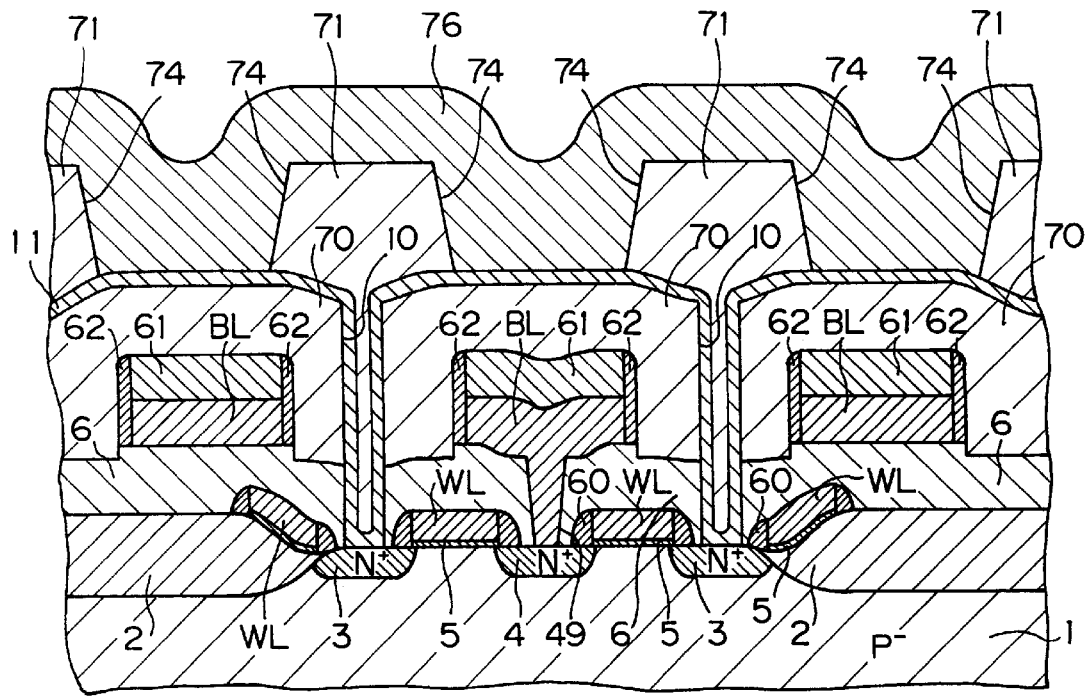
FIG. 34 is an enlarged cross-sectional view of another processing step of this same manufacturing method.
Figure 35:
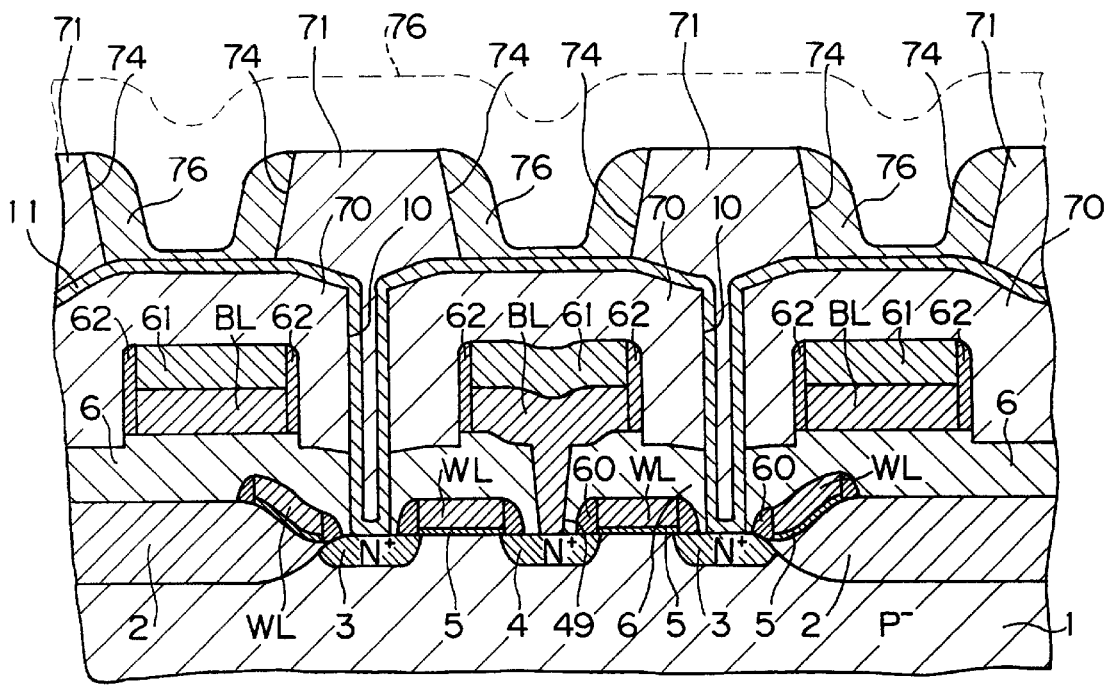
FIG. 35 is an enlarged cross-sectional view of another processing step of this same manufacturing method.

In this way, during etching, the silicon layer 96 can be sufficiently etched while etching the accumulated substance such as polymers (this is mainly a substance wherein the silicon has polymerized), and the natural oxide (there is also a little bit of this on the upper edge portion of spacer material 91), which are the origins of burrs. As a result, as shown in FIG. 25(C), polysilicon layer 96 has no burrs, region (A) of over 800 Å from the upper surface of the spacer material 91 is removed, and the side surfaces of the spacer material 91 are left with a perpendicular shape and a slightly reduced thickness.

Therefore, when the dielectric film 77 is adhered as presented in FIGS. 11 and 12, the film adhesion and film quality become good, and its insulating properties and voltage resistance can be improved. Moreover, since the generation of burrs can be prevented during etching, additional processes for removing the burrs are unnecessary, and the object capacitors can be manufactured with a minimum of processes.

In processes of this embodiment, preferably these are applied to the embodiments 1 and 2, but they can also be applied to other manufacturing processes.

FIGS. 26 and 27 show embodiment 4 wherein our invention is applied to a dynamic RAM. p In the manufacturing process for the dynamic RAM based on this embodiment, compared to the embodiment 3, it is different in that the burrs generated in the top of the polysilicon layer, which becomes the capacitor lower electrode, are removed after etching.

In other words, after the process for etching the polysilicon layer 96 shown in FIG. 9, in the event that burrs, like those mentioned above remain in the top portion of the polysilicon layer 96, anisotropic polysilicon etching is carried out after the etching process, for example, using an etching gas containing oxygen $O_2$ at 400 sccm, $CHF_3$ at 20 sccm, at 1.4 torr, and 350 W, the burrs are removed at an etching rate of 100 Å/min, and the shaping to the configuration shown in FIG. 25(c) can be done.

When removing the burr-like projections with this type of postprocessing, to transport the etching gas and introduce it into the processing chamber, the device shown in FIG. 26 can be used. In other words, a high-frequency voltage 112 is applied between the pair of electrodes 110-111, ions (radicals) of the etching gas 113 are generated, only the radicals 114 are introduced on top of the substrate 1 inside the chamber 115, isotropic etching is carried out, and anisotropic processing is not conducted since the ions have directivity.

In this postprocessing, since the etching of the oxide layer, the etching of the polysilicon layer, as well as the deposition process for the polysilicon, cannot coexist, it is better if each of these processing chambers are added, and a postprocessing chamber in which the burr-like projections are rounded (removed) is provided. The reason for this is that the processing can be consecutively done without changing the parameters for each treatment process, and without breaking the vacuum. A layout showing how such an postprocessing chamber 115 can be successively used along with the chamber for the process of the previous step is summarized in FIG. 27.

Preferably the processes of this embodiment are also applied to the embodiments 1 and 2, but they can be applied to other manufacturing processes.

Above, embodiments of our invention were explained, but in regard the embodiments, further variations based on the technical concept of our invention are possible.

For example, in the routines and assemblies of the processes, the type of etching gas, etc., various changes can be made, and the substances used, the patterns, etc., can also be changed. In particular, for the capacitor lower electrode material, besides polysilicon with large crystal granulation, amorphous silicon can be used; but in the case of amorphous silicon, there are instances when it may be profitable from the standpoint of forming the perpendicular shapes. Those shapes can also be cylindrical types of concentric circles and the like.

Also, in the embodiment 2, for the etching gas for the insulating layer and polysilicon layer, special selectivity or anisotropic properties are not necessary. In the embodiments 2 and 3, large numbers of capacitors do not necessarily have to be aligned.

In each of the embodiments, an explanation was given in memory cells of a COB construction, but our invention can of course be applied to memory cells of the CUB (cell under bit line) construction. In addition, the conductor type of the semiconductor region can be changed, and our invention can also be applied to other semiconductor memories and devices.

In our invention, as presented above, since a number of screen capacitors are placed at prescribed intervals on a semiconductor substrate, and along with these screen capacitors being respectively formed of a nearly vertical cylindrical lower electrode, dielectric film, and upper electrode, and the spacing in the alignment direction is smaller than the inner diameter of the lower electrode, the space between the adjacent capacitors can be narrowed and the degree of integration increased. Also, the penetration of the etchant into the spacing that is equivalent to the unmasked region of the mask used for patterning the spacer material for regulating the shape of the lower electrode during manufacture, which causes cumulated substance growth, does not readily occur, and because perpendicular anisotropic etching can be carried out well in the perpendicular direction, the thickness of the capacitor lower electrode can be sufficiently maintained after etching, and its perpendicular shape can be realized.

Also, a screen capacitor is provided on top of the semiconductor substrate, and since these screen capacitors are formed of a cylindrical lower electrode, dielectric film, and upper electrode cross section in the shape of an inverted frustum, at the same time spacer material that corresponds to the spacing between the lower electrodes connecting floor electrodes is used, the lower electrode is made so as to be provided in an unmasked region wherein the spacer material is removed, and a lower electrode with a cross section in the shape of an inverted frustum is obtained. Therefore, by giving the lower electrode this type of inverted frustum shape, the space between the connecting lower electrodes can be narrowed, and high density devices that allow high integration can be realized.

In this case, when forming the lower electrode with an inverted frustum shape, the side surfaces of the spacer material after etching the spacer material through the unmasked region of the first mask material were made slanted due to the adhesion of accumulated substances, but here, since the structural material layer of the lower electrode that was adhered is protected to the position of the upper surface of the spacer material by the second mask material and is not etched, the remaining lower electrode has a sufficient thickness, and the inverted frustum shape that corresponds to the slanted surface of the spacer material is exhibited. Due to this, in the lower electrode (in other words, the etching section of the spacer material), the spacing between adjacent lower electrodes is made small, and high densification and high integration as a capacitor can be realized.

Also, during the etching of the structural material layer for the lower electrode, the etching is done under conditions wherein the etching selectivity for oxides is lowered and isotropic etching components are provided, and since etching can be done so that the natural oxide film and the accumulated substances, such as polymers, that tend to accumulate on the outer surface and inner surface of the structural material layer for the lower electrode are not generated, the generation of burrs can be prevented without increasing the number of processes. Therefore, the dielectric film can be formed with excellent film quality and with sufficient thickness on top of the lower electrode, the insulating defects and voltage resistance can be improved, and reliability heightened.

Lastly, after etching the structural material of the lower electrode, since the burrs on its top portion are removed by isotropic etching, the lower electrode can be formed without any burrs, and the film thickness and film quality of the dielectric film can be maintained. Also, even if a process that removes the burrs is added, this can be easily done by sending it to a separate processing chamber and maintaining the vacuum.

We claim:

1. In a method of manufacturing a semiconductor by providing a semiconductor substrate and placing a number of stacked cell capacitors at a prescribed interval on a semiconductor substrate, each stacked cell capacitor having a cylindrical lower electrode, a dielectric film, and an upper electrode in the shape of an inverted frustum, the spacing in the alignment direction being smaller than the inner diameter of the lower electrode;

the improvement comprising the steps of:

forming spacer material for regulating the shape of the stacked cell capacitors on the semiconductor substrate;

forming a plurality of first mask materials by positioning them at prescribed intervals and aligning them on the spacer material so the spacing in the alignment direction is less than the diameter and thickness of the mask materials;

etching the spacer material is etched using the first mask materials to selectively remove the spacer material directly beneath the region of the spacing divide the spacer material into multiple units, the inner diameter of the lower electrode being determined by each spacer material;

adhering structural material layer of the lower electrode to a surface of the spacer material;

filling a second mask material between the separated plurality of spacer materials to a height less than the upper surface of the spacer material;

etching the structural material layer that is exposed on the upper surface and the vicinity of the spacer material;

removing the second mask material and leaving the structural material layer on the side surfaces of the spacer material;

removing the spacer material and forming the lower electrode;

forming the dielectric film on at least a surface of the lower electrode; and forming the upper electrode on a surface of the dielectric film.

2. The method of claim 1 wherein the diameter of the unmasked region of the spacer material or the spacing of the first mask material is more than one time and less than ten times the thickness of this first mask material.

3. The method of claim 1 wherein the diameter of the unmasked region of the spacer material is more than one time and less than ten times the combined total thickness of the thickness of this first mask material and the thickness of the unmasked region or of the material to be etched directly beneath the region of the spacing.

4. The method of claim 1 wherein etching of the spacing material is an anisotropic dry gas etch of a mixture of $CF_4$, $CHF_3$ and Ar.

* * * * *